(12) United States Patent
Yang et al.

(10) Patent No.: US 9,437,128 B2
(45) Date of Patent: Sep. 6, 2016

(54) DISPLAY SUBSTRATE AND DRIVING METHOD THEREOF, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Kai Yang, Beijing (CN); Xue Dong, Beijing (CN); Hyungkyu Kim, Beijing (CN); Haiwei Sun, Beijing (CN); Hao Zhang, Beijing (CN); Lingyun Shi, Beijing (CN); Renwei Guo, Beijing (CN); Peng Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/768,962

(22) PCT Filed: Dec. 30, 2014

(86) PCT No.: PCT/CN2014/095497
§ 371 (c)(1),
(2) Date: Aug. 19, 2015

(87) PCT Pub. No.: WO2016/019692
PCT Pub. Date: Feb. 11, 2016

(65) Prior Publication Data
US 2016/0196776 A1    Jul. 7, 2016

(30) Foreign Application Priority Data

Aug. 4, 2014   (CN) .......................... 2014 1 03795572

(51) Int. Cl.
*G09G 5/02*    (2006.01)
*G09G 3/20*    (2006.01)
*H01L 27/32*   (2006.01)

(52) U.S. Cl.
CPC ......... *G09G 3/2003* (2013.01); *H01L 27/3218* (2013.01); *G09G 2300/0452* (2013.01); *G09G 2330/021* (2013.01)

(58) Field of Classification Search
CPC ................. G09G 3/2003; G09G 2300/0452; G09G 2330/021; H01L 27/3218
USPC ......................................................... 345/694
See application file for complete search history.

(56) References Cited

U.S. PATENT DOCUMENTS 5,530,570 A * 6/1996 Terumoto .......... G02F 1/133514
                                                     349/106
6,650,391 B2 * 11/2003 Chang .............. G02F 1/136286
                                                      345/88

(Continued)

FOREIGN PATENT DOCUMENTS

CN    2504659 Y    8/2002
CN    1737650 A    2/2006

(Continued)

OTHER PUBLICATIONS

May 6, 2015—International Search Report Appn PCT/CN2014/095497 with Eng Tran of Written Opinion.

*Primary Examiner* — Temesgh Ghebretinsae
*Assistant Examiner* — Benyam Ketema
(74) *Attorney, Agent, or Firm* — Banner & Witcoff, Ltd.

(57) ABSTRACT

A display substrate and a driving method thereof and a display device are provided. The display substrate includes two types of pixel rows arranged alternately and repeatedly. In one type of pixel row, a second sub-pixel, a third sub-pixel, a second sub-pixel, a first sub-pixel and a third sub-pixel are arranged successively and repeatedly. In the other type of pixel row, a third sub-pixel, a first sub-pixel, a second sub-pixel, a third sub-pixel and a second sub-pixel are arranged successively and repeatedly. A center line of any sub-pixel in a column direction in a pixel row does not coincide with a center line of any sub-pixel in the column direction in an adjacent pixel row.

20 Claims, 6 Drawing Sheets

(56) References Cited

U.S. PATENT DOCUMENTS

| | | | | |
|---|---|---|---|---|
| 6,914,649 | B2* | 7/2005 | Liu | G02F 1/133514 345/694 |
| 8,446,435 | B2* | 5/2013 | Tomizawa | G09G 3/2003 345/690 |
| 2002/0140655 | A1* | 10/2002 | Liang | G09G 3/2003 345/89 |
| 2007/0070093 | A1* | 3/2007 | Lin | G02F 1/134336 345/694 |
| 2014/0307430 | A1* | 10/2014 | Lo | G09F 13/00 362/231 |
| 2015/0379916 | A1* | 12/2015 | Guo | G02F 1/136286 345/694 |

FOREIGN PATENT DOCUMENTS

| | | |
|---|---|---|
| CN | 103777393 A | 5/2014 |
| CN | 104166260 A | 11/2014 |
| TW | 200712714 | 4/2007 |

* cited by examiner

DISPLAY SUBSTRATE AND DRIVING METHOD THEREOF, AND DISPLAY DEVICE

The application is a U.S. National Phase Entry of International Application No. PCT/CN2014/095497 filed on Dec. 30, 2014, designating the United States of America and claiming priority to Chinese Patent Application No. 201410379572.5 filed on Aug. 4, 2014. The present application claims priority to and the benefit of the above-identified applications and the above-identified applications are incorporated by reference herein in their entirety.

TECHNICAL FIELD

Embodiments of the invention relate to a display substrate and a driving method thereof, and a display device.

BACKGROUND

In a conventional display device, a pixel is made up of sub-pixels in three colors of red, green and blue (RGB). In practical application, a resolution of the display device may be increased by increasing Pixels Per Inch (PPI) of the display device. In order to increase the PPI, it is necessary to decrease the size of pixels and an interval between pixels. Whereas, the process will reach a limit as the process is refined continuously.

In the conventional technology, three sub-pixels constitute a pixel. When a display device requires larger quantity of pixels to display at high resolution, more sub-pixels are demanded.

In the conventional technology, an actual display resolution of a display device is the same as its physical resolution. In order to obtain a higher display resolution, it is necessary to add the number of sub-pixels to increase the physical resolution of the display device. Due to the limit of process, it is hard to increase more sub-pixels if the number of sub-pixels has been increased to some extent. Numerous sub-pixels in the display device demand more data lines, such that power consumption of the display device is improved and an aperture ratio of the display device is reduced. In addition, there are a large number of sub-pixels in the display device and each sub-pixel is small in size, which causes difficulty in manufacturing process and high costs.

SUMMARY OF THE INVENTION

One embodiment of the invention provides a display substrate, comprising two types of pixel rows arranged alternately and repeatedly, wherein in one type of pixel row, a second sub-pixel, a third sub-pixel, a second sub-pixel, a first sub-pixel and a third sub-pixel are arranged successively and repeatedly; in the other type of pixel row, a third sub-pixel, a first sub-pixel, a second sub-pixel, a third sub-pixel and a second sub-pixel are arranged successively and repeatedly; a center line of any sub-pixel in a column direction in a pixel row does not coincide with a center line of any sub-pixel in the column line in an adjacent pixel row.

The first sub-pixels, the second sub-pixels and the third sub-pixels form a plurality of pixel groups, the plurality of pixel groups including a plurality of first pixel groups and a plurality of second pixel groups.

The pixel group consists of a first pixel row, a second pixel row and a third pixel row, the first pixel row including one second sub-pixel and one third sub-pixel, the second pixel row including one third sub-pixel, one first sub-pixel and one second sub-pixel, and the third pixel row including one second sub-pixel and one third sub-pixel; each of the first pixel group includes the second pixel row and the third pixel row or includes the first pixel row and the second pixel row; each of the second pixel groups includes the first pixel row, the second pixel row and the third pixel row.

In two adjacent pixel groups in the column direction, a third pixel row of one pixel group and a first pixel row of the other pixel group share a second sub-pixel and a third sub-pixel.

Another embodiment of the invention provides a display device, comprising the display substrate according to any embodiment of the invention.

Still another embodiment of the invention provides a driving method of a display substrate, comprising:

acquiring an output value of the first sub-pixel, an output value of the second sub-pixel and an output value of the third sub-pixel;

outputting the output value of the first sub-pixel, the output value of the second sub-pixel and the output value of the third sub-pixel.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 3b is a schematic diagram of the output values of pixels in FIG. 3a;

FIG. 4b is a schematic diagram of the output values of pixels in FIG. 4a;

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
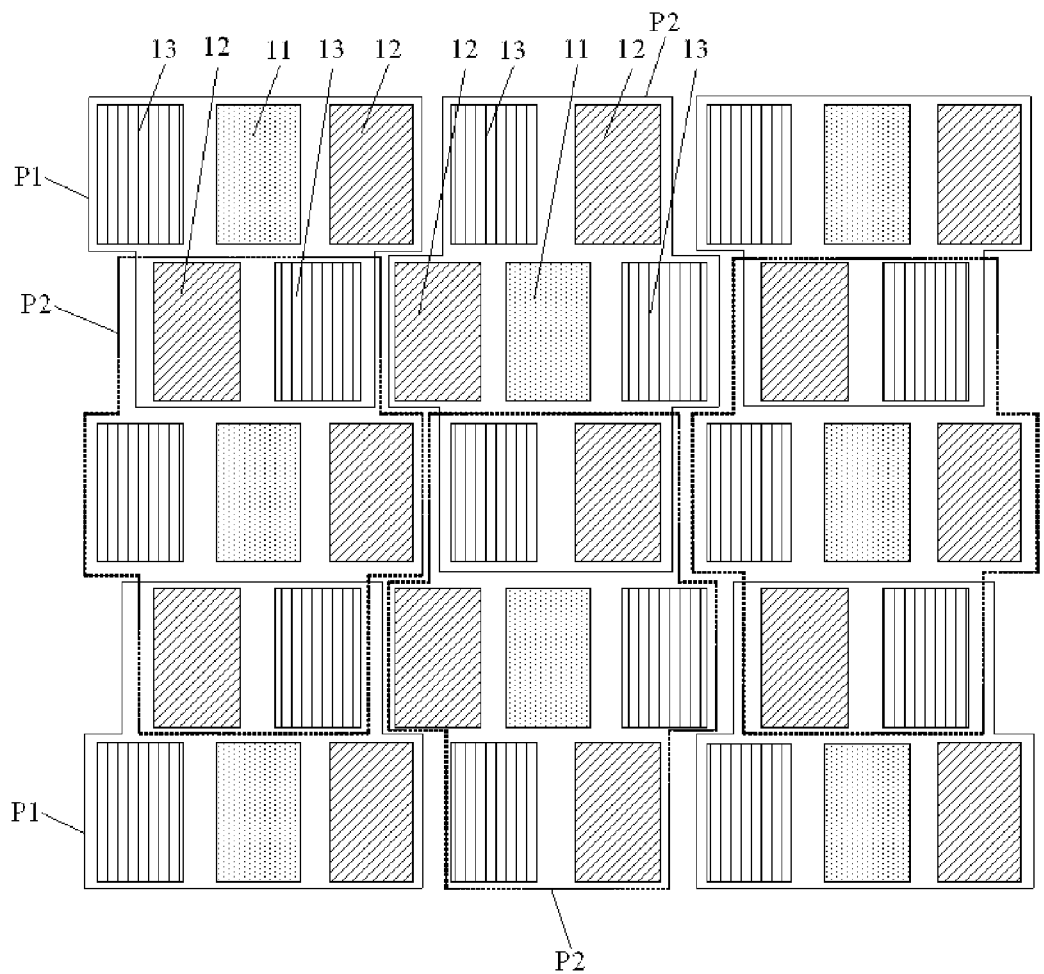
FIG. 1 is a structural schematic diagram of a display substrate provided by a first embodiment of the invention.

FIG. 1 is a structural schematic diagram of a display substrate provided by a first embodiment of the invention. As illustrated in FIG. 1, the display substrate comprises two pixel rows (two types of pixel rows) arranged repeatedly. For example, the two types of pixel rows are arranged alternately and repeatedly in a column direction, as illustrated in FIG. 1. For example, the column direction is a direction perpendicular to a row direction of pixel row. In one pixel row, a second sub-pixel 12, a third sub-pixel 13, a second sub-pixel 12, a first sub-pixel 11 and a third sub-pixel 13 are arranged successively and repeatedly; in the other pixel row, a third sub-pixel 13, a first sub-pixel 11, a second sub-pixel 12, a third sub-pixel 13 and a second sub-pixel 12 are arranged successively and repeatedly. A center line of any sub-pixel in the column direction in a pixel row does not coincide with a center line of any sub-pixel in the column direction in an adjacent pixel row.

The first sub-pixels 11, the second sub-pixels 12 and the third sub-pixels 13 form a plurality of pixel groups. The plurality of pixel groups includes a plurality of first pixel groups P1 and a plurality of second pixel groups P2.

For example, constituent parts of the pixel groups include a first pixel row, a second pixel row and a third pixel row. The first pixel row includes one second sub-pixel and one third sub-pixel. The second pixel row includes one third sub-pixel, one first sub-pixel and one second sub-pixel. The third pixel row includes one second sub-pixel and one third sub-pixel.

The first pixel group P1 includes a second pixel row and a third pixel row or includes a first pixel row and a second pixel row. The second pixel group P2 includes a first pixel row, a second pixel row and a third pixel row. For example, the first pixel row includes a second sub-pixel 12 and a third sub-pixel 13. The second pixel row includes a third sub-pixel 13, a first sub-pixel 11 and a second sub-pixel 12. The third pixel row includes a second sub-pixel 12 and a third sub-pixel 13. In the plurality of pixel groups P1 and the plurality of pixel groups P2, a third pixel row in a pixel group shares a second sub-pixel and a third sub-pixel with a first pixel row in an adjacent pixel group.

For example, as illustrated in FIG. 1, in the second pixel row, the first sub-pixel is a sub-pixel in the middle among three sub-pixels.

For example, as illustrated in FIG. 1, in a same column of pixel group, sub-pixels in respective first pixel rows are arranged in a same sequence, sub-pixels in respective second pixel rows are arranged in a same sequence, and sub-pixels in respective third pixel rows are arranged in a same sequence.

For example, as illustrated in FIG. 1, in each pixel group, the second sub-pixels and the third sub-pixels are arranged around the first sub-pixels alternately. Any two adjacent second sub-pixel and third sub-pixel form a pixel together with the first sub-pixel.

For example, as illustrated in FIG. 1, each of the second pixel groups includes seven sub-pixels, the seven sub-pixels include a first sub-pixel in the middle, and three second sub-pixels and three third sub-pixels arranged around the first sub-pixel alternately.

For example, as illustrated in FIG. 1, each of the first pixel groups includes five sub-pixels, of which two second sub-pixels and two third sub-pixels are arranged around one first sub-pixel alternately.

In the embodiment, there are two pixel rows arranged repeatedly. The pixel row arranged repeatedly in the order of a third sub-pixel 13, a first sub-pixel 11, a second sub-pixel 12, a third sub-pixel 13 and a second sub-pixel 12 is a previous pixel row of the pixel row arranged repeatedly in the order of a second sub-pixel 12, a third sub-pixel 13, a second sub-pixel 12, a first sub-pixel 11 and a third sub-pixel 13. In practical application, optionally, the pixel row arranged repeatedly in the order of a third sub-pixel 13, a first sub-pixel 11, a second sub-pixel 12, a third sub-pixel 13 and a second sub-pixel 12 may also be a next pixel row of the pixel row arranged repeatedly in the order of a second sub-pixel 12, a third sub-pixel 13, a second sub-pixel 12, a first sub-pixel 11 and a third sub-pixel 13, but such a case is not specifically diagramed in FIG. 1.

In the embodiment, a first pixel group P1 is defined as a pixel group including five sub-pixels, and the first pixel group P1 includes two pixel rows. A second pixel group P2 is defined as a pixel group including seven sub-pixels, and the second pixel group P2 includes three pixel rows. The first pixel group P1 may be located on an upper edge or a lower edge in a display region of the display substrate. For example, as illustrated in FIG. 1, a first pixel group P1 including a second pixel row and a third pixel row is located on an upper edge, and a first pixel group P1 including a first pixel row and a second pixel row is located on a lower edge. The second pixel group P2 may be located on an upper edge, a lower edge or locations other than the lower and upper edges. For example, as illustrated in FIG. 1, a second pixel group P2 on the left is located a location other than the lower and upper edges; a second pixel group P2 in an upper middle portion is located on the upper edge; a second pixel group P2 in a lower middle portion is located on the lower edge. It should also be noted that: FIG. 1 is only described with partial sub-pixels in the display substrate as example. According to the number of pixel rows in the entire display substrate, the first pixel group P1 has three cases: in case 1, the display substrate is provided with a first pixel group P1 including a second pixel row and a third pixel row; in case 2, the display substrate is provided with a first pixel group P1 including a first pixel row and a second pixel row; in case 3, the display substrate is provided with a first pixel group P1 including a second pixel row and a third pixel row and a first pixel group P1 including a first pixel row and a second pixel row.

In practical application, optionally, the first pixel group may be located on a left edge or a right edge of the display region of the display substrate. It may be regarded that the display substrate in the drawing of the embodiment is rotated by 90° to obtain the display substrate in such case. At this time, the pixel row of the display substrate in the embodiment becomes the pixel column of the display substrate in such case. The case will not be described or diagramed any more.

In the embodiment, sub-pixels in respective pixel rows of the pixel groups are arranged in two manners. A first arrangement manner takes the first pixel group P1 and the second pixel group P2 on the left of FIG. 1 as an example: a second sub-pixel 12 and a third sub-pixel 13 in the first pixel row are arranged successively; a third sub-pixel 13, a first sub-pixel 11 and a second sub-pixel 12 in the second pixel row are arranged successively; and a second sub-pixel 12 and a third sub-pixel 13 in the third pixel row are arranged successively. A second arrangement manner takes the second pixel group P2 in the middle of FIG. 1 as an example: a third sub-pixel 13 and a second sub-pixel 12 in the first sub-pixel are arranged successively; a second sub-pixel 12, a first sub-pixel 11 and a third sub-pixel 13 in the second pixel row are arranged successively; and a third sub-pixel 13 and a second sub-pixel 12 in the third pixel row are arranged successively.

In the first arrangement manner, the second sub-pixel 12 in the first pixel row and the third sub-pixel 13 and first sub-pixel 11 in the second pixel row form a first pixel; the second sub-pixel 12 and third sub-pixel 13 in the first pixel row and the first sub-pixel 11 in the second pixel group form a second pixel; the third sub-pixel 13 in the first pixel row and the first sub-pixel 11 and second sub-pixel 12 in the second pixel row form a third pixel; the third sub-pixel 13 and first sub-pixel 11 in the second pixel row and the second sub-pixel 12 in the third pixel row form a fourth pixel; the first sub-pixel 11 in the second pixel row and the second sub-pixel 12 and third sub-pixel 13 in the third pixel row form a fifth pixel; the first sub-pixel 11 and second sub-pixel 12 in the second pixel row and the third sub-pixel 13 in the third pixel row form a sixth pixel.

In the second arrangement manner, the third sub-pixel 13 in the first pixel row and the second sub-pixel 12 and first sub-pixel 11 in the second pixel form a first pixel; the third sub-pixel 13 and second sub-pixel 12 in the first pixel row and the first sub-pixel 11 in the second pixel row form a second pixel; the second sub-pixel 12 in the first pixel row and the first sub-pixel 11 and third sub-pixel 13 in the second pixel row form a third pixel; the second sub-pixel 12 and first sub-pixel 11 in the second pixel row and the third sub-pixel 13 in the third pixel row form a fourth pixel; the first sub-pixel 11 in the second pixel row and the third sub-pixel 13 and second sub-pixel 12 in the third pixel row form a fifth pixel; the first sub-pixel 11 and third sub-pixel 13 in the second pixel row and the second sub-pixel 12 in the third pixel row form a sixth pixel.

In FIG. 1, for example, the first pixel group P1 on the upper edge on the left and the second pixel group P2 on the left share the second sub-pixel 12 and the third sub-pixel 13 in the second row; the second pixel group P2 in the upper middle portion and the second pixel group P2 in the lower middle portion share the third sub-pixel 13 and the second sub-pixel 12 in the third row.

Figure 3A:
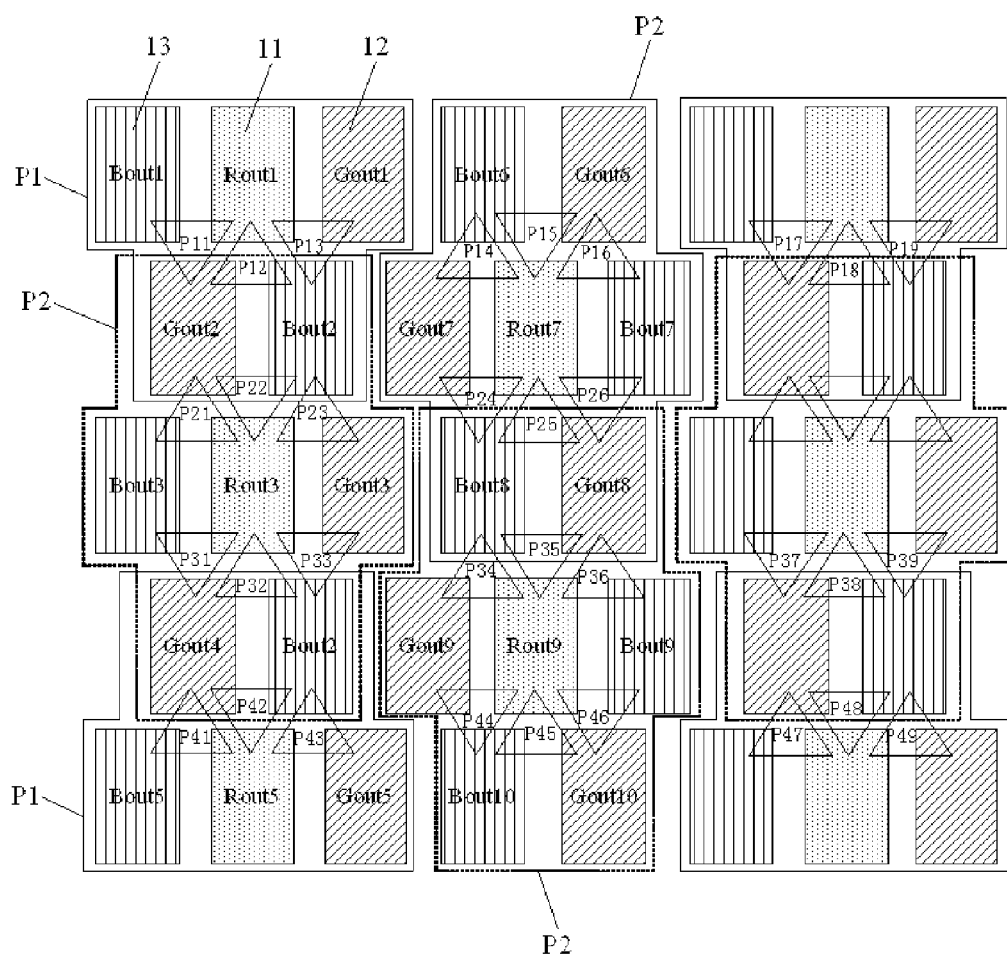
FIG. 3a is a schematic diagram illustrating calculation of output values of respective sub-pixels in pixel groups on lower and upper edges in the first embodiment.

In each first pixel group P1, five sub-pixels may form three pixels; whereas in each second pixel group P2, seven sub-pixels may form six pixels, as illustrated in FIG. 3a of a schematic diagram illustrating calculation of output values of respective sub-pixels. In the embodiment, seven pixels can form six sub-pixels by sharing sub-pixels, but in the prior art, eighteen sub-pixels are required to form 6 pixels.

In FIG. 1 of the present embodiment, the first sub-pixel 11 is a red sub-pixel R, the second sub-pixel 12 is a green sub-pixel G, and the third sub-pixel 13 is a blue sub-pixel B.

Figure 2A:
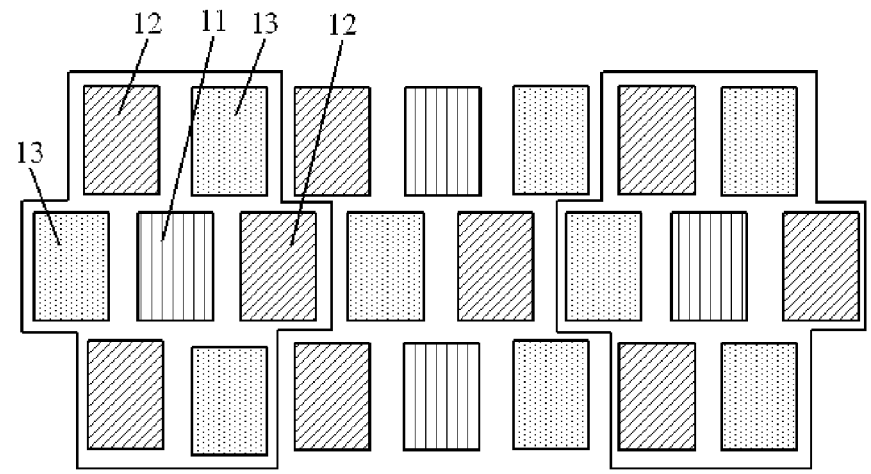
FIG. 2a is another schematic diagram illustrating color arrangement of respective sub-pixels in the display substrate.
Figure 2B:
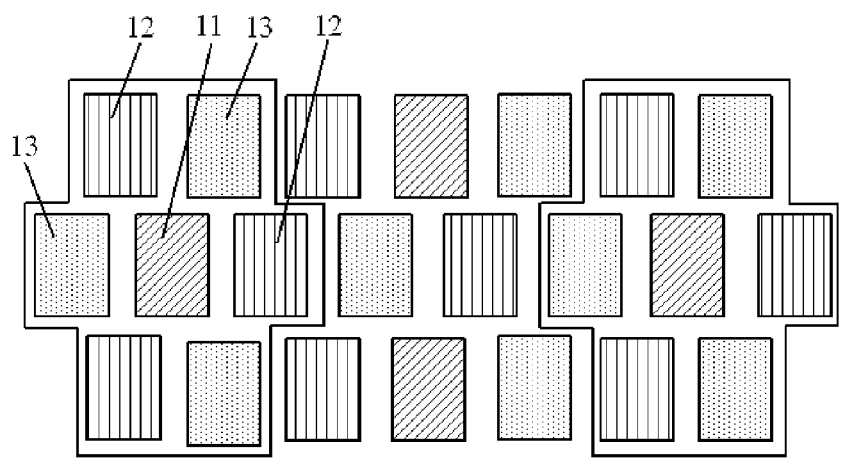
FIG. 2b is still another schematic diagram illustrating color arrangement of respective sub-pixels in the display substrate.

Optionally, the first sub-pixel 11, the second sub-pixel 12, and the third sub-pixel 13 may be sub-pixels in other colors. For example, FIG. 2a is another schematic diagram illustrating color arrangement of respective sub-pixels in the display substrate. As illustrated in FIG. 2a, the first sub-pixel 11 is a blue sub-pixel B, the second sub-pixel 22 is a green sub-pixel G, and the third sub-pixel 13 is a red sub-pixel R. For example, FIG. 2b is still another schematic diagram illustrating color arrangement of respective sub-pixels in the display substrate. As illustrated in FIG. 2b, the first sub-pixel 11 is a green sub-pixel G, the second sub-pixel 22 is a blue sub-pixel B and the third sub-pixel 13 is a red sub-pixel R.

Hereinafter, a specific example is used to describe in detail a calculation method of output values of respective sub-pixels in the display substrate provided by the embodiment.

As for each sub-pixel used for forming a plurality of pixels, a weighted average process is conducted on output values of the sub-pixel corresponding to each pixel associated with the sub-pixel, to generate an output value of the sub-pixel.

FIG. 3a is a schematic diagram illustrating calculation of output values of respective sub-pixels in pixel groups on lower and upper edges in the first embodiment. As illustrated in FIG. 3a, sub-pixels on three vertexes of a triangle (Δ) form pixels in respective pixel groups.

Figure 3B:
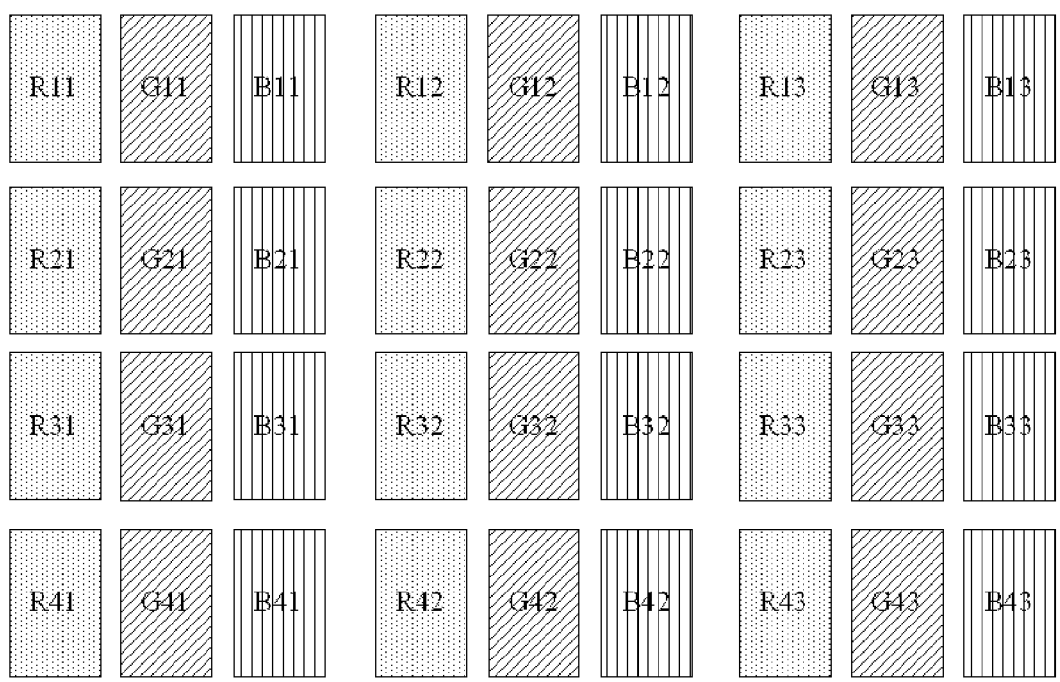

As for the first pixel group P1 on the upper edge on the left, the second pixel row in the first pixel group P1 is located on the upper edge, and an arrangement manner of respective sub-pixels in the first pixel group P1 is the first arrangement manner. In the first pixel group P1, the third sub-pixel 13 and first sub-pixel 11 in the second pixel row and the second sub-pixel 12 in the third pixel row form a fourth pixel P11; the first sub-pixel 11 in the second pixel row and the second sub-pixel 12 and third sub-pixel 13 in the third pixel row form a fifth pixel P12; the first sub-pixel 11 and second sub-pixel 12 in the second pixel row and the third sub-pixel 13 in the third pixel row form a sixth pixel P13. The second pixel group P2 on the left and the first pixel group P1 share the third pixel row in the first pixel group P1 as the first pixel row of the second pixel group P2. Then in the second pixel group P2, the second sub-pixel 12 in the first pixel row and the third sub-pixel 13 and first sub-pixel 11 in the second pixel row form a first pixel P21; the second sub-pixel 12 and third sub-pixel 13 in the first pixel row and the first sub-pixel 11 in the second pixel row form a second pixel P22; the third sub-pixel 13 in the first pixel row and the first sub-pixel 11 and second sub-pixel 12 in the second pixel row form a third pixel P23; the third sub-pixel 13 and first sub-pixel 11 in the second pixel row and the second sub-pixel 12 in the third pixel row form a fourth pixel P31; the first sub-pixel 11 in the second pixel row and the second sub-pixel 12 and third sub-pixel 13 in the third pixel row form a fifth pixel P32; the first sub-pixel 11 and second sub-pixel 12 in the second pixel row and the third sub-pixel 13 in the third pixel row form a sixth pixel P33. Because each pixel should include a first sub-pixel 11, a second sub-pixel 12 and a third sub-pixel 13, an input value of each pixel includes an input value $R_{ij}$ of the first sub-pixel, an input value $B_{ij}$ of the second sub-pixel and an input value $G_{ij}$ of the third sub-pixel, where, i is a row number of pixel and j is a column number of pixel. FIG. 3b is a schematic diagram of input values of pixels in FIG. 3a. As illustrated in FIG. 3b, for example, an input value of the fourth pixel 11 includes an input value R11 of the first sub-pixel 11, an input value G11 of the second sub-pixel 12 and an input value B11 of the third sub-pixel 13; an input value of the fifth pixel P12 includes an input value R12 of the first sub-pixel 11, an input value G12 of the second sub-pixel 12 and an input value B12 of the third sub-pixel 13; an input value of the first pixel P21 includes an input value R21 of the first sub-pixel 11, an input value G21 of the second sub-pixel 12 and an input value B21 of the third sub-pixel 13; the rest of the pixels in FIG. 3a are illustrated in a similar way, which will not be repeated. As illustrated in FIG. 3a and FIG. 3b, an input value B11 of the third sub-pixel 13 of the fourth pixel P11 in the first pixel group is set as an output value Bout1 of the third sub-pixel 13 in the second pixel row, namely Bout1=B11; a weighted average process is conducted on the input value R11 of the first sub-pixel 11 of the fourth pixel P11, the input value R12 of the first sub-pixel 11 of the fifth pixel P12 and the input value R12 of the first sub-pixel 11 of the sixth pixel P13 in the first pixel group to generate an output value Rout1 of the first sub-pixel 11 in the second pixel row, namely Rout1=(R11+R12+R13)/3; an input value G13 of the second sub-pixel 12 of the sixth pixel P13 in the first pixel group is set as an output value Gout1 of the second sub-pixel 12 in the second pixel row, namely Gout1=G13; a weighted average process is conducted on the input value G11 of the second sub-pixel 12 of the fourth pixel P11 and the input value G12 of the second sub-pixel 12 of the fifth pixel P12 in the first pixel group, and an input value G21 of a second sub-pixel 12 of a first pixel P21 and an input value G22 of a second sub-pixel 12 of a second pixel P22 in an adjacent pixel group which shares the sub-pixels of the third pixel row in the first pixel group with the first pixel group, to generate an output value Gout2 of the second sub-pixel 12 in third pixel row, namely Gout2=(G11+G12+G21+G22)/4; a weighted average process is conducted on the input value B12 of the third sub-pixel 13 of the fifth pixel P12 and the input value B13 of the third sub-pixel 13 of the sixth pixel P13 in the first pixel group, and an input value B22 of a third sub-pixel 13 of the second pixel P22 and an input value B23 of a third sub-pixel 13 of a third pixel P23 in the adjacent pixel group which shares the sub-pixels of the third pixel row in first pixel group with the first pixel group, to generate an output value Bout2 of the third sub-pixel 13 in third pixel row, namely Bout2=(B12+B13+B22+B23)/4.

As for the first pixel group P1 on the upper edge on the left, the second pixel row in the first pixel group P1 is located on the upper edge, and an arrangement manner of respective sub-pixels in the first pixel group P1 can also be the second arrangement manner. In the second arrangement manner, the principle for calculating output values of respective sub-pixels in the first pixel group P1 is similar to that in the first arrangement manner, which will not be repeated here.

As for the first pixel group P1 on the lower edge on the left, the second pixel row in the first pixel group P1 is located on the lower edge, and an arrangement manner of respective sub-pixels in the first pixel group P1 is the first arrangement manner. The second sub-pixel 12 in the first pixel row and the third sub-pixel 13 and first sub-pixel 11 in the second pixel row form a first pixel P41; the second sub-pixel 12 and third sub-pixel 13 in the first pixel row and the first sub-pixel 12 in the second pixel row form a second pixel P42; the third sub-pixel 13 in the first pixel row and the first sub-pixel 11 and second sub-pixel 12 in the second pixel row form a third pixel P43. As illustrated in FIG. 3b, for example, an input value of the first pixel P41 includes an input value R41 of the first sub-pixel 12, an input value G41 of the second sub-pixel 12 and an input value B41 of the third sub-pixel 13; an input value of the second pixel P42 includes an input value R42 of the first sub-pixel 11, an input value G42 of the second sub-pixel 12 and an input value B42 of the third sub-pixel 13; an input value of the third pixel P43 includes an input value R43 of the first sub-pixel 11, an input value G43 of the second sub-pixel 12 and an input value B43 of the third sub-pixel 13. As illustrated in FIG. 3a and FIG. 3b, a weighted average process is conducted on of the input value G41 of the second sub-pixel 12 of the first pixel P41 and the input value G42 of the second sub-pixel 12 of the second pixel P42 in the first pixel group, and an input value G31 of a second sub-pixel 12 of a fourth pixel P31 and an input value G32 of a second sub-pixel 12 of a fifth pixel P32 in an adjacent pixel group which shares the sub-pixels of the first pixel row in the first pixel group with the first pixel group, to generate an output value Gout4 of the second sub-pixel 12 in the first pixel row, namely Gout4=(G31+G32+G41+G42)/4; a weighted average process is conducted on the input value B42 of the third sub-pixel 13 of the second pixel P42 and the input value B43 of the third sub-pixel 13 of the third pixel P43 in the first pixel group, and an input value B32 of a third sub-pixel 13 of the fifth pixel P32 and an input value B33 of a third sub-pixel 13 of a sixth pixel P33 in the adjacent pixel group which shares the sub-pixels in the first pixel row in first pixel group with the first group, to generate an output value Bout4 of the third sub-pixel 13 in the first pixel row, namely Bout4=(B32+B33+B42+B43)/4; an input value B41 of the third sub-pixel 13 of the first pixel P41 in the first pixel group is set as an output value Bout5 of the third sub-pixel in the second pixel row, namely Bout5=B41; a weighted average process is conducted on the input value R41 of the first sub-pixel 11 of the first pixel P41, the input value R42 of the first sub-pixel 11 of the second pixel P42 and the input value R43 of the first sub-pixel 11 of the third pixel P43 in the first pixel group, to generate an output value Rout5 of the first sub-pixel 11 in the second pixel row, namely Rout5=(R41+R42+R43)/3; an input value G43 of the second sub-pixel 12 of the third pixel P43 in the first pixel group is set as an output value Gout5 of the second sub-pixel 12 in the second pixel row, namely Gout5=G43.

As for the first pixel group P1 on the lower edge on the left, the second pixel row in the first pixel group P1 is located on the lower edge, and an arrangement manner of respective sub-pixels in the first pixel group P1 can also be the second arrangement manner. In the second arrangement manner, the principle for calculating output values of respective sub-pixels in the first pixel group P1 is similar to that in the first arrangement manner, which will not be repeated here.

As for the second pixel group P2 on the upper edge in the middle, the first pixel row in the second pixel group P2 is located on the upper edge, and an arrangement manner of respective sub-pixels in the second pixel group P2 is the second arrangement manner. In the second pixel group P2, the third sub-pixel 13 in the first pixel row and the second sub-pixel 12 and first sub-pixel 11 in the second pixel row form a first pixel P14; the third sub-pixel 13 and second sub-pixel 12 in the first pixel row and the first sub-pixel 11 in the second pixel row form a second pixel P15; the second sub-pixel 12 in the first pixel row and the first sub-pixel 11 and third sub-pixel 13 in the second pixel row form a third pixel P16; the second sub-pixel 12 and first sub-pixel 11 in the second pixel row and the third sub-pixel 13 in the third pixel row form a fourth pixel P24; the first sub-pixel 11 in the second pixel row and the third sub-pixel 13 and second sub-pixel 12 in the third pixel row form a fifth pixel P25; the first sub-pixel 11 and third sub-pixel 13 in the second pixel row and the second sub-pixel 12 in the third pixel row form a sixth pixel P26. As illustrated in FIG. 3a and FIG. 3b, a weighted average process is conducted on an input value B14 of the third sub-pixel 13 of the first pixel P14 in the second pixel group and an input value B15 of the third sub-pixel 13 of the second pixel P15 in the second pixel group, to generate an output value Bout6 of the third sub-pixel 13 in the first pixel row, namely Bout6=(B14+B15)/2; a weighted average process on an input value G15 of the second sub-pixel 12 of the second pixel P15 and an input value G16 of the second sub-pixel 12 of the third pixel P16 in the second pixel group, to generate an output value Gout6 of the second sub-pixel 12 in the first pixel row, namely Gout6=(G15+G16)/2; a weighted average process is conducted on an input value G14 of the second sub-pixel 12 of the first pixel P14 and an input value G24 of the second sub-pixel 12 of the fourth pixel P24 in the second pixel group, to generate an output value Gout7 of the second sub-pixel 12 in the second pixel row, namely Gout7=(G14+G24)/2; a weighted average process is conducted on an input value R14 of the first sub-pixel 11 of the first pixel P14, an input value R15 of the first sub-pixel 11 of the second pixel P14, an input value R16 of the first sub-pixel 11 of the third pixel P16, an input value R24 of the first sub-pixel 11 of the fourth pixel P24, an input value R25 of the first sub-pixel 11 of the fifth pixel P25 and an input value R26 of the first sub-pixel 11 of the sixth pixel P26, to generate an output value Rout7 of the first sub-pixel 11 in the second pixel row, namely Rout7=(R14+R15+R16+R24+R25+R26)/6; a weighted average process is conducted on an input value B16 of the third sub-pixel 13 of the third pixel P16 and an input value B26 of the third sub-pixel 13 of the sixth pixel P26 in the second pixel group, to generate an output value Bout7 of the third sub-pixel 13 in the second pixel row, namely Bout7=(B16+B26)/2; a weighted average process is conducted on an input value B24 of the third sub-pixel 13 of the fourth pixel P24 and an input value B25 of the third sub-pixel 13 of the fifth pixel P25 in the second pixel group, and an input value B34 of a third sub-pixel 13 of a first pixel P34 and an input value B35 of a third sub-pixel 13 of a second pixel P35 in an adjacent pixel group which shares the sub-pixels of the third pixel row in the second pixel group with the second pixel group, to generate an output value Bout8 of the third sub-pixel 13 in the third pixel row, namely Bout8=(B24+B25+B34+B35)/4; a weighted average process is conducted on an input value G25 of the second sub-pixel 12 of the fifth pixel P25 and an input value G26 of the second sub-pixel 12 of the sixth pixel P26 in the second pixel group, and an input value G35 of the second sub-pixel 12 of the second pixel P35 and an input value G36 of a second sub-pixel 12 of a third pixel P36 in the adjacent pixel group which shares the sub-pixels of the third pixel row in the second pixel group with the second pixel group, to generate an output value Gout8 of the second sub-pixel 12 in the third pixel row, namely Gout8=(G25+G26+G35+G36)/4.

As for the second pixel group P2 on the upper edge in the middle, the first pixel row in the second pixel group P2 is located on the upper edge, and an arrangement manner of respective sub-pixels in the second pixel group P2 can also be the first arrangement manner. In the first arrangement manner, the principle for calculating output values of respective sub-pixels in the second pixel group P2 is similar to that in the second arrangement manner, which will not be repeated here.

As for the second pixel group P2 on the lower edge in the middle, the first pixel row in the second pixel group P2 is located on the upper edge, and an arrangement manner of respective sub-pixels in the second pixel group P2 is the second arrangement manner. In the second pixel group P2, the second sub-pixel 12 and first sub-pixel 11 in the second pixel row and the third sub-pixel 13 in the third pixel row form a fourth pixel P44; the first sub-pixel 11 in the second pixel row and the third sub-pixel 13 and second sub-pixel 12 in the third pixel row form a fifth pixel P45; the first sub-pixel 11 and third sub-pixel 13 in the second pixel row and the second sub-pixel 12 in the third pixel row form a sixth pixel P46. Because the second pixel group P2 and another second pixel group P2 on the upper edge in the middle share the second sub-pixel and the third sub-pixel, Bout8 and Gout8 will not be calculated repeatedly. As illustrated in FIG. 3a and FIG. 3b, a weighted average process is conducted on an input value G34 of the second sub-pixel 12 of the first pixel P34 and an input value G44 of the second sub-pixel 12 of the fourth pixel P44 in the second pixel group, to generate an output value Gout9 of the second sub-pixel 12 in the second pixel row, namely Gout9=(G34+G44)/2; a weighted average process is conducted on an input value R34 of the first sub-pixel 11 of the first pixel P34, an input value R35 of the first sub-pixel 11 of the second pixel P35, an input value R36 of the first sub-pixel 11 of the third pixel P36, an input value R44 of the first sub-pixel 11 of the fourth pixel P44, an input value R45 of the first sub-pixel 11 of the fifth pixel P45 and an input value R46 of the first sub-pixel 11 of the sixth pixel P46 in the second pixel group, to generate an output value Rout9 of the first sub-pixel 11 in the second pixel row, namely Rout9=(R34+R35+R36+R44+R45+R46)/6; a weighted average process is conducted on an input value B36 of the third sub-pixel 13 of the third pixel P36 and an input value B46 of the third sub-pixel 13 of the sixth pixel P46 in the second pixel group, to generate an output value Bout9 of the third sub-pixel 13 in the second pixel row, namely Bout9=(B36+B46)/2; a weighted average process is conducted on an input value B44 of the third sub-pixel 13 of the fourth pixel P44 and an input value B45 of the third sub-pixel 13 of the fifth pixel P45 in the second pixel group, to generate an output value Bout10 of the third sub-pixel 13 in the third pixel row, namely Bout10=(B44+B45)/2; a weighted average process is conducted on an input value G45 of the second sub-pixel 12 of the fifth pixel P45 and an input value G46 of the second sub-pixel 12 of the sixth pixel P46 in the second pixel group, to generate an output value Gout10 of the second sub-pixel 12 in the third pixel row, namely Gout10=(G45+G46)/2.

Figure 4A:
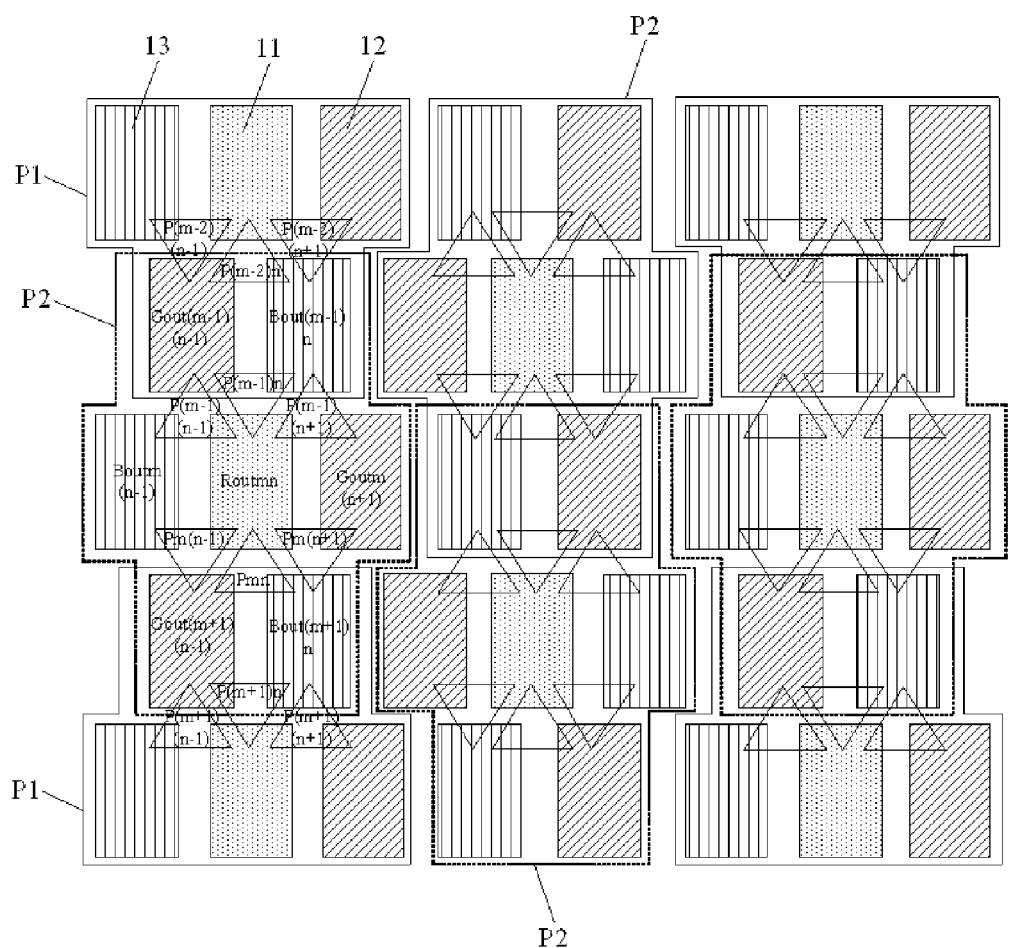
FIG. 4a is a schematic diagram illustrating calculation of output values of respective sub-pixels in pixel groups outside lower and upper edges in the first embodiment.

FIG. 4a is a schematic diagram illustrating calculation of output values of respective sub-pixels in pixel groups at locations other than lower and upper edges in the first embodiment. As illustrated in FIG. 4a, sub-pixels on three vertexes of a triangle (Δ) form pixels in respective pixel groups. As for the second pixel group P2 on the lower edge in the middle, the first pixel row in second pixel group P2 is located on the lower edge, and an arrangement manner of respective sub-pixels in the second pixel group P2 may be the first arrangement manner. In the first arrangement manner, the principle for calculating output values of respective sub-pixels in the second pixel group P2 is similar to that in the second arrangement manner, which will not be repeated here.

Figure 4B:
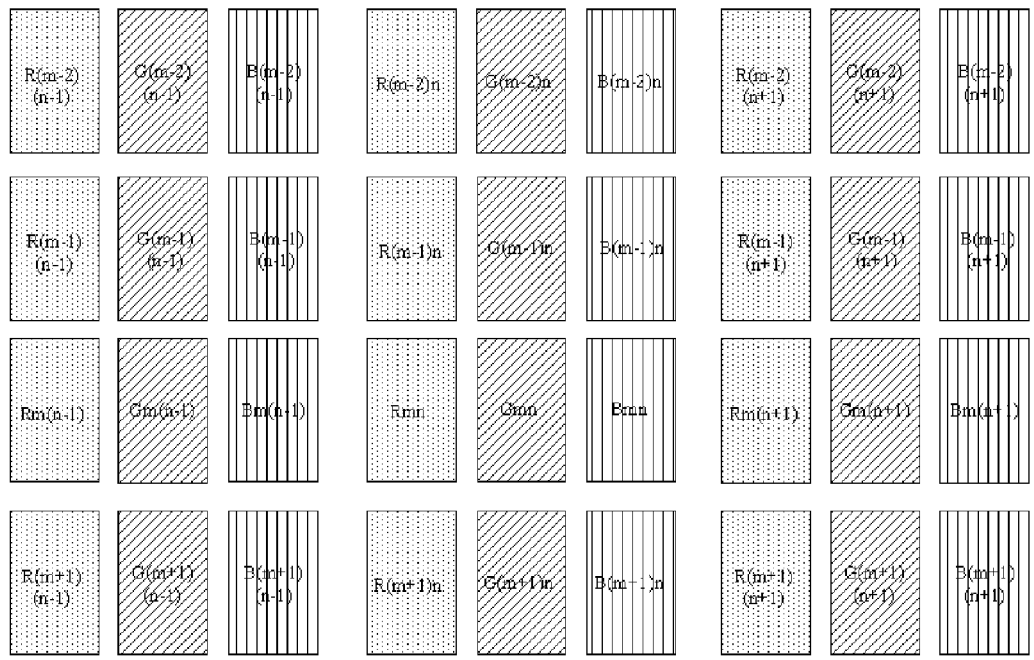

As for the second pixel group P2 in a location other than upper and lower edges on the left, the first pixel row, the second pixel row and the third pixel row in the second pixel group P2 are located other than the upper and lower edges, and an arrangement manner of respective sub-pixels in the second pixel group P2 is the first arrangement manner. In the second pixel group P2, the second sub-pixel 12 in first pixel row and the third sub-pixel 13 and first sub-pixel 11 in the second pixel row form a first pixel P(m−1)(n−1); the second sub-pixel 12 and third sub-pixel 13 in the first pixel row and the first sub-pixel 11 in the second pixel row form a second pixel P(m−1)n; the third sub-pixel 13 in the first pixel row and the first sub-pixel 11 and second sub-pixel 12 in the second pixel row form a third pixel P(m−1)(n+1); the third sub-pixel 13 and first sub-pixel 11 in the second pixel row and the second sub-pixel 12 in the third pixel row form a fourth pixel Pm(n−1); the first sub-pixel 11 in the second pixel row, the second sub-pixel 12 and third sub-pixel 13 in the third pixel row form a fifth pixel Pmn; the first sub-pixel 11 and second sub-pixel 12 in the second pixel row and the third sub-pixel 13 in the third pixel row form a sixth pixel Pm(n+1). Where, m is a row number of pixel and n is a column number of pixel. FIG. 4b is a schematic diagram of the input values of pixels in FIG. 4a. As illustrated in FIG. 4b, for example, an input value of the first pixel P(m−1)(n−1) includes that an input value R(m−1)(n−1) of the first sub-pixel 11, an input value G(m−1)(n−1) of the second sub-pixel 12 and an input value B(m−1)(n−1) of the third sub-pixel 13; an input value of the second pixel P(m−1)n includes an input value R(m−1)n of the first sub-pixel 11, an input value of G(m−1)n of the second sub-pixel 12 and an input value B(m−1)n of the third sub-pixel 13; an input value of the fifth pixel Pmn includes an input value Rmn of the first sub-pixel 11, an input value Gmn of the second sub-pixel 12 and an input value Bmn of the third sub-pixel 13; the rest of the pixels in FIG. 4a are illustrated in a similar way, which will not be repeated. As illustrated in FIG. 4a and FIG. 4b, a weighted average process is conducted on the input value G(m−1)(n−1) of the second sub-pixel 12 of the first pixel P(m−1)(n−1) and the input value G(m−1)n of the second sub-pixel 12 of the second pixel P(m−1)n in the second pixel group, and an input value G(m−2)(n−1) of a second sub-pixel 12 of a fourth pixel P(m−2)(n−1) and an input value G(m−2)n of a second sub-pixel 12 of a fifth pixel P(m−2)n in an adjacent pixel group which shares the sub-pixels of the first pixel row in the second pixel group with the second pixel group, to generate an output value Gout(m−1)(n−1) of the second sub-pixel 12 in the first pixel row, namely Gout(m−1)(n−1)=(G(m−1)(n−1)+G(m−1)n+G(m−2)(n−1)+G(m−2)n)/4; a weighted average process is conducted on the input value B(m−1)n of the third sub-pixel 13 of the second pixel P(m−1)n and the input value B(m−1)(n+1) of the third sub-pixel 13 of the third pixel P(m−1)(n+1), and an input value B(m−2)n of a third sub-pixel 13 of the fifth pixel P(m−2)n and an input value B(m−2)(n+1) of a third sub-pixel 13 of a sixth pixel P(m−2)(n+1) in the adjacent pixel group which shares the sub-pixels of the first pixel row in the second pixel group with the second pixel group, to generate an output value Bout(m−1)n of the third sub-pixel 13 in the first pixel row, namely Bout(m−1)n, (B(m−1)n+B(m−1)(n+1)+B(m−2)n+B(m−2)(n+1))/4; a weighted average process is conducted on the input value B(m−1)(n−1) of the third sub-pixel 13 of the first pixel P(m−1)(n−1) and the input value Bm(n−1) of the third sub-pixel 13 of the fourth pixel Pm(n−1) in the second pixel group, to generate an output value Boutm(n−1) of the third sub-pixel 13 in the second pixel row, namely Boutm(n−1)=(B(m−1)(n−1)+Bm(n−1))/2; a weighted average process is conducted on the input value R(m−1)(n−1) of the first sub-pixel 11 of the first pixel P(m−1)(n−1), the input value R(m−1)n of the first sub-pixel 11 of the second pixel P(m−1)n, the input value R(m−1)(n+1) of the first sub-pixel 11 of the third pixel P(m−1)(n+1), an input value Rm(n−1) of the first sub-pixel 11 of the fourth pixel Pm(n−1), an input value Rmn of the first sub-pixel 11 of the fifth pixel Pmn and an input value Rm(n+1) of the first sub-pixel 11 of the sixth pixel Pm(n+1) in the second pixel group, to generate an output value Routmn of the first sub-pixel 11 in the second pixel row, namely Routmn=(R(m−1)(n−1)+R(m−1)n+R(m−1)(n+1)+Rm(n−1)+Rmn+Rm(n+1))/6; a weighted average process is conducted on an input value G(m−1)(n+1) of the second sub-pixel 12 of the third pixel P(m−1)(n+1) and an input value Gm(n+1) of the second sub-pixel 12 of the sixth pixel Pm(n+1) in the second pixel group, to generate an output value Goutm(n+1) of the second sub-pixel 12 in the second pixel row, namely Goutm(n+1)=(G(m−1)(n+1)+Gm(n+1))/2; a weighted average process is conducted on an input value Gm(n−1) of the second sub-pixel 12 of the fourth pixel Pm (n−1) and the input value Gmn of the second sub-pixel 12 of the fifth pixel Pmn in the second pixel group, and an input value G(m+1)(n−1) of a second sub-pixel 12 of a first pixel P(m+1)(n−1) and an input value G(m+1)n of a second sub-pixel 12 of a second pixel P(m+1)n in an adjacent pixel group which shares the sub-pixels of the third pixel row in the second pixel group with the second pixel group, to generate an output value Gout(m+1)(n−1) of the second sub-pixel 12 in the third pixel row, namely Gout(m+1)(n−1)=(Gm (n−1)+Gmn+G(m+1)(n−1)+G(m+1)n)/4; a weighted average process is conducted on the input value Bmn of the third sub-pixel 13 of the fifth pixel Pmn and an input value Bm(n+1) of the third sub-pixel 13 of the sixth pixel Pm(n+1) in the second pixel group, and an input value B(m+1)n of a third sub-pixel 13 of the second pixel P(m+1)n and an input value B(m+1)(n+1) of a third sub-pixel 13 of a third pixel P(m+1)(n+1) in the adjacent pixel group which shares the sub-pixels of the third pixel row in the second pixel group with the second pixel group, to generate an output value Bout(m+1)n of the third sub-pixel 13 in the third pixel row, namely Bout(m+1)n=(Bmn+Bm(n+1)+B(m+1)n+B(m+1)(n+1))/4.

As for the second pixel group P2 in the location other than upper and lower edges on the left, the first pixel row, the second pixel row and the third pixel row in the second pixel group P2 are not located at the upper and lower edges, and an arrangement manner of respective sub-pixels in the second pixel group P2 can also be the second arrangement method. In the second arrangement manner, the principle for calculating output values of respective sub-pixels in the second pixel group P2 is similar to that in the first arrangement manner, which will not be repeated here.

It should be noted that: because two adjacent pixel groups in the embodiment share the second sub-pixel and the third sub-pixel, it is unnecessary to calculate the output values of the shared second sub-pixel and third sub-pixel in the adjacent pixel group after calculating the output values of respective sub-pixels in one pixel group.

In the technical solution of the display substrate provided by the present embodiment, the sub-pixels of the display substrate form a plurality of first pixel groups and a plurality of second pixel groups. A first pixel group includes five sub-pixels and a second pixel group includes seven sub-pixels. Based on the arrangement manner of sub-pixels in the embodiment, seven sub-pixels may form six pixels by sharing sub-pixels, so that the display device may achieve higher display resolution with lower physical resolution. In the embodiment, seven sub-pixels are required to display six pixels by sharing sub-pixels, which reduces the number of sub-pixels in the display substrate and further the number of data lines, so as to reduce power consumption of the display device and increase an aperture ratio of the display device. In the embodiment, seven sub-pixels are required to display six pixels by sharing sub-pixel, which reduces the number of sub-pixels in the display substrate, so that a size of each sub-pixel may be relatively large, so as to reduce difficulty and cost of manufacturing process. In the embodiment, if the size of each sub-pixel is set to be smaller, the display device may acquire higher physical resolution, in order to improve the display resolution of the display device. In the embodiment, by setting new arrangement manners and calculating the output value of each sub-pixel by using a corresponding virtual algorithm, the input value of each sub-pixel is more close to the input value thereof, so as to improve the display quality. The display device of the embodiment may realize higher display resolution with lower physical resolution, so that the process cost is reduced. The display device of the embodiment may realize higher display resolution with fewer sub-pixels, so that the display effect is increased.

A second embodiment of the invention provides a display device. The display device comprises the display substrate provided by the first embodiment. Please refer to the descriptions in First embodiment for the descriptions of the display substrate, which will not be repeated here.

Optionally, in the embodiment, the display device may be a liquid crystal display device and the display substrate may be an array substrate. Thus, the display device may further include a color filter substrate. The array substrate is arranged opposite to the color filter substrate, and a liquid crystal layer is filled between the array substrate and the color filter substrate.

Optionally, in the embodiment, the display device may be an organic light-emitting device, and the display substrate may be an Organic Light-Emitting Diode (OLED) display substrate.

In the technical solution of the display device provided by the embodiment, the sub-pixels of the display substrate form a plurality of first pixel groups and a plurality of second pixel groups. A first pixel group includes five sub-pixels and a second pixel group includes seven sub-pixels. Based on the arrangement manner of sub-pixels in the embodiment, seven sub-pixels may form six pixels by sharing sub-pixels, so that the display device may achieve higher display resolution with lower physical resolution. In the embodiment, seven sub-pixels are required to display six pixels by sharing sub-pixels, which reduces the number of sub-pixels in the display substrate and further the number of data lines, so as to reduce power consumption of the display device and increase an aperture ratio of the display device. In the embodiment, seven sub-pixels are required to display six pixels by sharing sub-pixels, which reduces the number of sub-pixels in the display substrate, so that a size of each sub-pixel may be relatively large, so as to reduce difficulty and cost of manufacturing process. In the embodiment, if the size of each sub-pixel is set to be smaller, the display device may acquire higher physical resolution, in order to improve the display resolution of the display device. In the embodiment, by setting new arrangement manners and calculating the output value of each sub-pixel by using a corresponding virtual algorithm, the input value of each sub-pixel is more close to the input value thereof, so as to improve the display quality. The display device of the embodiment may realize higher display resolution with lower physical resolution, so that the process cost is reduced. The display device of the embodiment may realize higher display resolution with fewer sub-pixels, so that the display effect is increased.

Figure 5:
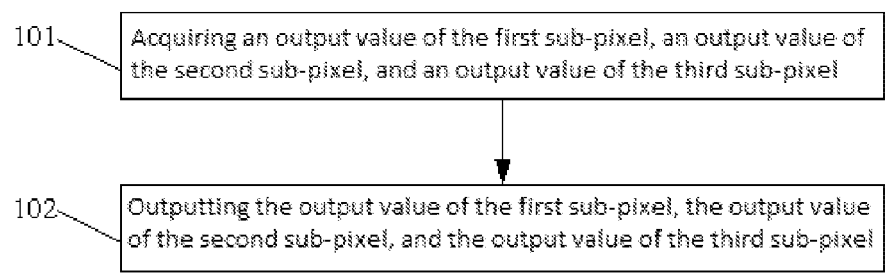
FIG. 5 is a flow chart illustrating a driving method of a display substrate provided by a third embodiment of the invention.

A third embodiment provides a driving method of a display substrate. The method is used to drive the display substrate provided in First embodiment. FIG. 5 is a flow chart of a driving method of a display substrate provided by Third embodiment. As illustrated in FIG. 5, the method comprises the following Step 101 and Step 102.

Step 101: acquiring an output value of the first sub-pixel, an output value of the second sub-pixel and an output value of the third sub-pixel.

Step 102: outputting the output value of the first sub-pixel, the output value of the second sub-pixel and the output value of the third sub-pixel.

For example, in each pixel group, the second sub-pixels and the third sub-pixels are arranged around the first sub-pixel alternately. Any two adjacent second sub-pixel and third sub-pixel, together with the first sub-pixel, form a pixel. The above step 102 includes: for each sub-pixel used for forming a plurality of pixels, conducting a weighted average process on output values of the sub-pixel corresponding to each pixel associated with the sub-pixel, to generate an output value of the sub-pixel.

Optionally, the second pixel row in first pixel group is located on an upper edge; the second sub-pixel and third sub-pixel in the first pixel row are arranged successively, the third sub-pixel, first sub-pixel and second sub-pixel in the second pixel row are arranged successively, and the second sub-pixel and third sub-pixel in the third pixel row are arranged successively. The step 101 may include: setting an input value of the third sub-pixel of the fourth pixel in the first pixel group as an output value of the third sub-pixel in the second pixel row; conducting a weighted average process on an input value of the first sub-pixel of the fourth pixel, an input value of the first sub-pixel of the fifth pixel, and an input value of the first sub-pixel of the sixth pixel in the first pixel group, to generate an output value of the first sub-pixel in the second pixel row; setting an input value of the second sub-pixel of the sixth pixel in the first pixel group as an output value of the second sub-pixel in the second pixel row; conducting a weighted average process on an input value of the second sub-pixel of the fourth pixel and an input value of the second sub-pixel of the fifth pixel in the first pixel group, and an input value of a second sub-pixel of a first pixel and an input value of a second sub-pixel of a second pixel in an adjacent pixel group which shares the sub-pixels of third pixel row in the first pixel group with the first pixel group, to generate an output value of the second sub-pixel of third pixel row; conducting a weighted average process on an input value of the third sub-pixel of the fifth pixel and an input value of the third sub-pixel of the sixth pixel in the first pixel group, and an input value of a third sub-pixel of second pixel and an input value of a third sub-pixel of a third pixel in the adjacent pixel group which shares the sub-pixels in the third pixel row in the first pixel group with the first pixel group, to generate an output value of the third sub-pixel of the third pixel row.

Optionally, the second pixel row in the first pixel group is located on an upper edge; the third sub-pixel and second sub-pixel in the first pixel row are arranged successively; the second sub-pixel, first sub-pixel and third sub-pixel in the second pixel row are arranged successively, and the third sub-pixel and second sub-pixel in the third pixel row are arranged successively; then step 101 may include: setting an input value of the second sub-pixel of the fourth pixel in the first pixel group as an output value of the second sub-pixel of the second pixel row; conducting a weighted average process on an input value of the first sub-pixel of the fourth pixel, an input value of the first sub-pixel of the fifth pixel, and an input value of the first sub-pixel of the sixth pixel in the first pixel group, to generate an output value of the first sub-pixel of the second pixel row; setting an input value of the third sub-pixel of the sixth pixel in the first pixel group as an output value of the third sub-pixel in the second pixel row; conducting a weighted average process on an input value of the third sub-pixel of the fourth pixel and an input value of the third sub-pixel of the fifth pixel in the first pixel group, and an input value of a third sub-pixel of a first pixel and an input value of a third sub-pixel of a second pixel in an adjacent pixel group which shares the sub-pixels of the third pixel row in first pixel group with the first pixel group, to generate an output value of the third sub-pixel of the third pixel row; conducting a weighted average process on an input value of the second sub-pixel of the fifth pixel and an input value of the second sub-pixel of the sixth pixel in the first pixel group, and an input value of a second sub-pixel of second pixel and an input value of a second sub-pixel of a third pixel in the adjacent pixel group which shares the sub-pixels of the third pixel row in the first pixel group with the first pixel group, to generate the output value of the second sub-pixel of the third pixel row.

Optionally, the second pixel row in the first pixel group is located on a lower edge; the second sub-pixel and third sub-pixel in the first pixel row are arranged successively, the third sub-pixel, first sub-pixel and second sub-pixel in the second pixel row are arranged successively, the second sub-pixel and third sub-pixel in the third pixel row are arranged successively; then step 101 may include: conducting a weighted average process on an input value of the second sub-pixel of the first pixel and an input value of the second sub-pixel of the second pixel in the first pixel group, and an input value of a second sub-pixel of a fourth pixel and an input value of a second sub-pixel of a fifth pixel in an adjacent pixel group which shares the sub-pixels of the first pixel row in the first pixel group with the first pixel group, to generate an output value of the second sub-pixel of the first pixel row; conducting a weighted average process on an input value of the third sub-pixel of the second pixel and an input value of the third sub-pixel of the third pixel in the first pixel group, and an input value of a third sub-pixel of the fifth pixel and an input value of a third sub-pixel of a sixth pixel in the adjacent pixel group which shares the sub-pixels of the first pixel row in the first pixel group with the first pixel group, to generate an output value of the third sub-pixel of the first pixel row; setting an input value of the third sub-pixel of the first pixel in the first pixel group as an output value of the third sub-pixel of the second pixel row; conducting a weighted average process on an input value of the first sub-pixel of the first pixel, an input value of the first sub-pixel of the second pixel and an input value of the first sub-pixel of the third pixel in the first pixel group, to generate an output value of the first sub-pixel in the second pixel row; setting an input value of the second sub-pixel of the third pixel in the first pixel group as an output value of the second sub-pixel of the second pixel row.

Optionally, the second pixel row in the first pixel group is located on a lower edge, the third sub-pixel and second sub-pixel in the first pixel row are arranged successively, the second sub-pixel, first sub-pixel and third sub-pixel in the second pixel row are arranged successively, the third sub-pixel and second sub-pixel in the third pixel row are arranged successively; then step 101 may include: conducting a weighted average process on an input value of the third sub-pixel of the first pixel and an input value of the third sub-pixel of the second pixel in the first pixel group, and an input value of a third sub-pixel of a fourth pixel and an input value of a third sub-pixel of a fifth pixel in an adjacent pixel group which shares the sub-pixels of the first pixel row in the first pixel group with the first pixel group, to generate an output value of the third sub-pixel of the first pixel row; conducting a weighted average process on an input value of the second sub-pixel of the second pixel and an input value of the second sub-pixel of the third pixel in the first pixel group, and an input value of a second sub-pixel of the fifth pixel and an input value of a second sub-pixel of a sixth pixel in the adjacent pixel group which shares the sub-pixels of the first pixel row in the first pixel group with the first pixel group, to generate an output value of the second sub-pixel of the first pixel row; setting an input value of the second sub-pixel of the first pixel in the first pixel group as an output value of the second sub-pixel of the second pixel row; conducting a weighted average process on an input value of the first sub-pixel of the first pixel, an input value of the first sub-pixel of the second pixel and an input value of first sub-pixel of third pixel in the first pixel group, to generate an output value of the first sub-pixel of the second pixel row; setting an input value of the third sub-pixel of the third pixel in the first pixel group as an output value of the third sub-pixel of the second pixel row.

Optionally, the first pixel row in the second pixel group is located on an upper edge; the second sub-pixel and third sub-pixel in the first pixel row are arranged successively, the third sub-pixel, first sub-pixel and second sub-pixel in the second pixel row are arranged successively, the second sub-pixel and third sub-pixel in the third pixel row are arranged successively; then step 101 may include: conducting a weighted average process on an input value of the second sub-pixel of the first pixel and an input value of the second sub-pixel of the second pixel in the second pixel group, to generate an output value of the second sub-pixel in the first pixel row; conducting a weighted average process on an input value of the third sub-pixel of the second pixel and an input value of the third sub-pixel of the third pixel in the second pixel group, to generate an output value of the third sub-pixel of the first pixel row; conducting a weighted average process on an input value of the third sub-pixel of the first pixel and an input value of the third sub-pixel of the fourth pixel in the second pixel group, to generate an output value of the third sub-pixel of the second pixel row; conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel and an input value of the first sub-pixel of the sixth pixel, to generate an output value of the first sub-pixel of the second pixel row; conducting a weighted average process on an input value of the second sub-pixel of the third pixel and an input value of the second sub-pixel of the sixth pixel in the second pixel group, to generate an output value of the second sub-pixel of the second pixel row; conducting a weighted average process on an input value of the second sub-pixel of the fourth pixel and an input value of the second sub-pixel of the fifth pixel in the second pixel group, and an input value of a second sub-pixel of a first pixel and an input value of a second sub-pixel of a second pixel in an adjacent pixel group which shares the sub-pixels of the third pixel row in the second pixel group with the second pixel group, to generate an output value of the second sub-pixel of the third pixel row; conducting a weighted average process on an input value of the third sub-pixel of the fifth pixel and an input value of the third sub-pixel of the sixth pixel in the second pixel group, and an input value of a third sub-pixel of the second pixel and an input value of a third sub-pixel of a third pixel in the adjacent pixel group which shares the sub-pixels of the third pixel row in the second pixel group with the second pixel group, to generate an output value of the third sub-pixel of the third pixel row.

Optionally, the first pixel row in the second pixel group is located on an upper edge; the third sub-pixel and second sub-pixel in the first pixel row are arranged successively, the second sub-pixel, first sub-pixel and third sub-pixel in the second pixel row are arranged successively, the third sub-pixel and second sub-pixel in the third pixel row are arranged successively; then step 101 may include: conducting a weighted average process on an input value of the third sub-pixel of the first pixel and an input value of the third sub-pixel of the second pixel in the second pixel group, to generate an output value of the third sub-pixel in the first pixel row; conducting a weighted average process on an input value of the second sub-pixel of the second pixel and an input value of the second sub-pixel of the third pixel in the second pixel group, to generate an output value of the second sub-pixel of the first pixel row; conducting a weighted average process on an input value of the second sub-pixel of the first pixel and an input value of the second sub-pixel of the fourth pixel in the second pixel group, to generate an output value of the second sub-pixel of the second pixel row; conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row; conducting a weighted average process on an input value of the third sub-pixel of the third pixel and an input value of the third sub-pixel of the sixth pixel in the second pixel group, to generate an output value of the third sub-pixel of the second pixel row; conducting a weighted average process on an input value of the third sub-pixel of the fourth pixel and an input value of the third sub-pixel of the fifth pixel in the second pixel group, and an input value of a third sub-pixel of the first pixel and an input value of a third sub-pixel of a second pixel in the adjacent pixel group which shares the sub-pixels of the third pixel row in the second pixel group with the second pixel group, to generate an output value of the third sub-pixel of the third pixel row; conducting a weighted average process on an input value of the second sub-pixel of the fifth pixel and an input value of the second sub-pixel of the sixth pixel in the second pixel group, and an input value of the second sub-pixel of the second pixel and an input value of a second sub-pixel of a third pixel in the adjacent pixel group which shares the sub-pixels of the third pixel row in the second pixel group with the second pixel group, to generate an output value of the second sub-pixel of the third pixel row.

Optionally, the third pixel row in the second pixel group is located on a lower edge; the second sub-pixel and third sub-pixel in the first pixel row are arranged successively, the third sub-pixel, first sub-pixel and second sub-pixel in the second pixel row are arranged successively, the second sub-pixel and third sub-pixel in the third pixel row are arranged successively; then step 101 may include: conducting a weighted average process on an input value of the second sub-pixel of the first pixel and an input value of the second sub-pixel of the second pixel in the second pixel group, and an input value of a second sub-pixel of a fourth pixel and an input value of a second sub-pixel of a fifth pixel in an adjacent pixel group which shares the sub-pixels of the first pixel row in the second pixel group with the second pixel group, to generate an output value of the second sub-pixel of the first pixel row; conducting a weighted average process on an input value of the third sub-pixel of the second pixel and an input value of the third sub-pixel of the third pixel in the second pixel group, and an input value of a third sub-pixel of the fifth pixel and an input value of a third sub-pixel of a sixth pixel in the adjacent pixel group which shares the sub-pixels of the first pixel row in the second pixel group with the second pixel group, to generate an output value of the third sub-pixel of the first pixel row; conducting a weighted average process on an input value of the third sub-pixel of the first pixel and an input value of the third sub-pixel of the fourth pixel in the second pixel group, to generate an output value of the third sub-pixel of the second pixel row; conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row; conducting a weighted average process on an input value of the second sub-pixel of the third pixel and an input value of the second sub-pixel of the sixth pixel in the second pixel group, to generate an output value of the second sub-pixel of the second pixel row; conducting a weighted average process on an input value of the second sub-pixel of the fourth pixel and an input value of the second sub-pixel of the fifth pixel in the second pixel group, to generate an output value of the second sub-pixel of the third pixel row; conducting a weighted average process on an input value of the third sub-pixel of the fifth pixel and an input value of the third sub-pixel of the sixth pixel in the second pixel group, to generate an output value of the third sub-pixel of the third pixel row.

Optionally, the third pixel row in the second pixel group is located on a lower edge, the third sub-pixel and second sub-pixel in the first pixel row are arranged successively, the second sub-pixel, first sub-pixel and third sub-pixel in the second pixel row are arranged successively, the third sub-pixel and second sub-pixel in the third pixel row are arranged successively; then step 101 may include: conducting a weighted average process on an input value of the third sub-pixel of the first pixel and an input value of the third sub-pixel of the second pixel in the second pixel group, and an input value of a third sub-pixel of a fourth pixel and an input value of a third sub-pixel of a fifth pixel in an adjacent pixel group which shares the sub-pixels of the first pixel row in the second pixel group with the second pixel group, to generate an output value of the third sub-pixel of the first pixel row; conducting a weighted average process on an input value of the second sub-pixel of the second pixel and an input value of the second sub-pixel of the third pixel in the second pixel group, and an input value of a second sub-pixel of the fifth pixel and an input value of a second sub-pixel of a sixth pixel in the adjacent pixel group which shares the sub-pixels of the first pixel row in the second pixel group with the second pixel group, to generate an output value of the second sub-pixel of the first pixel row; conducting a weighted average process on an input value of the second sub-pixel of the first pixel and an input value of the second sub-pixel of the fourth pixel in the second pixel group, to generate an output value of the second sub-pixel of the second pixel row; conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row; conducting a weighted average process on an input value of the third sub-pixel of the third pixel and an input value of the third sub-pixel of the sixth pixel in the second pixel group, to generate an output value of the third sub-pixel of the second pixel row; conducting a weighted average process on an input value of the third sub-pixel of the fourth pixel and an input value of the third sub-pixel of the fifth pixel in the second pixel group, to generate an output value of the third sub-pixel of the third pixel row; conducting a weighted average process on an input value of the second sub-pixel of the fifth pixel and an input value of the second sub-pixel of the sixth pixel in the second pixel group, to generate an output value of the second sub-pixel of the third pixel row.

Optionally, the second pixel group is located at a location other than the upper and lower edges, the second sub-pixel and third sub-pixel in the first pixel row are arranged successively, the third sub-pixel, first sub-pixel and second sub-pixel in the second pixel row are arranged successively, the second sub-pixel and third sub-pixel in the third pixel row are arranged successively; the acquiring an output value of the first sub-pixel, an output value of the second sub-pixel and an output of the third sub-pixel includes: conducting a weighted average process on an input value of the second sub-pixel of the first pixel and an input value of the second sub-pixel of the second pixel in the second pixel group, and an input value of a second sub-pixel of a fourth pixel and an input value of a second sub-pixel of a fifth pixel in an adjacent pixel group which shares the sub-pixels of the first pixel row in the second pixel group with the second pixel group, to generate an output value of the second sub-pixel of the first pixel row; conducting a weighted average process on an input value of the third sub-pixel of the second pixel and an input value of the third sub-pixel of the third pixel in the second pixel group, and an input value of a third sub-pixel of the fifth pixel and an input value of a third sub-pixel of a sixth pixel in the adjacent pixel group which shares the sub-pixels of the first pixel row in the second pixel group with the second pixel group, to generate an output value of the third sub-pixel of the first pixel row; conducting a weighted average process on an input value of the third sub-pixel of the first pixel and an input value of the third sub-pixel of the fourth pixel in the second pixel group, to generate an output value of the third sub-pixel of the second pixel row; conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row; conducting a weighted average process on an input value of the second sub-pixel of the third pixel and an input value of the second sub-pixel of the sixth pixel in the second pixel group, to generate an output value of the second sub-pixel of the second pixel row; conducting a weighted average process on an input value of the second sub-pixel of the fourth pixel and an input value of the second sub-pixel of the fifth pixel in the second pixel group, and an input value of a second sub-pixel of the first pixel and an input value of a second sub-pixel of a second pixel in the adjacent pixel group which shares the sub-pixels of the third pixel row in the second pixel group with the second pixel group, to generate an output value of the second sub-pixel of the third pixel row; conducting a weighted average process on an input value of the third sub-pixel of the fifth pixel and an input value of the third sub-pixel of the sixth pixel in the second pixel group, and an input value of a third sub-pixel of the second pixel and an input value of a third sub-pixel of a third pixel in the adjacent pixel group which shares the sub-pixels of the third pixel row in the second pixel group with the second pixel group, to generate an output value of the third sub-pixel of the third pixel row.

Optionally, the second pixel group is located at a location other than the upper and lower edges, the third sub-pixel and second sub-pixel in the first pixel row are arranged successively, the second sub-pixel, first sub-pixel and third sub-pixel in the second pixel row are arranged successively, the third sub-pixel and second sub-pixel in the third pixel row are arranged successively; then step 101 may include: conducting a weighted average process on an input value of the third sub-pixel of the first pixel and an input value of the third sub-pixel of the second pixel in the second pixel group, and an input value of a third sub-pixel of a fourth pixel and an input value of a third sub-pixel of a fifth pixel in an adjacent pixel group which shares the sub-pixels of the first pixel row in the second pixel group with the second pixel group, to generate an output value of the third sub-pixel of the first pixel row; conducting a weighted average process on an input value of the second sub-pixel of the first pixel and an input value of the second sub-pixel of the third pixel in the second pixel group, and an input value of a second sub-pixel of the fifth pixel and an input value of a second sub-pixel of a sixth pixel in the adjacent pixel group which shares the sub-pixels of the first pixel row in the second pixel group with the second pixel group, to generate an output value of the second sub-pixel of the first pixel row; conducting a weighted average process on an input value of the second sub-pixel of the first pixel and an input value of the second sub-pixel of the fourth pixel in the second pixel group, to generate an output value of the second sub-pixel of the second pixel row; conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row; conducting a weighted average process on an input value of the third sub-pixel of the third pixel and an input value of the third sub-pixel of the sixth pixel in the second pixel group, to generate an output value of the third sub-pixel of the second pixel row; conducting a weighted average process on an input value of the third sub-pixel of the fourth pixel and an input value of the third sub-pixel of the fifth pixel in the second pixel group, and an input value of a third sub-pixel of the first pixel and an input value of a third sub-pixel of a second pixel in the adjacent pixel group which shares the sub-pixels of the third pixel row in the second pixel group with the second pixel group, to generate an output value of the third sub-pixel of the third pixel row; conducting a weighted average process on an input value of the second sub-pixel of the fifth pixel and an input value of the second sub-pixel of the sixth pixel in the second pixel group, and an input value of the second sub-pixel of the second pixel and an input value of a second sub-pixel of a third pixel in the adjacent pixel group which shares the sub-pixels of the third pixel row in the second pixel group with the second pixel group, to generate an output value of the second sub-pixel of the third pixel row.

The calculation process of output values of respective first sub-pixels, output values of respective second sub-pixel and output values of respective third sub-pixel in the embodiment is the same as that of the first embodiment. The specific descriptions may refer to the first embodiment, which will not be repeated here.

In the technical solution of the display substrate fabricated by the manufacturing method of the display substrate provided by the embodiment, the sub-pixels of the display substrate form a plurality of first pixel groups and a plurality of second pixel groups. A first pixel group includes five sub-pixels and a second pixel group includes seven sub-pixels. Based on the arrangement manner of sub-pixels in the embodiment, seven sub-pixels may form six pixels by sharing sub-pixels, so that the display device may achieve higher display resolution with lower physical resolution. In the embodiment, seven sub-pixels are required to display six pixels by sharing sub-pixels, which reduces the number of sub-pixels in the display substrate and further the number of data lines, so as to reduce power consumption of the display device and increase an aperture ratio of the display device. In the embodiment, seven sub-pixels are required to display six pixels by sharing sub-pixels, which reduces the number of sub-pixels in the display substrate, so that a size of each sub-pixel may be relatively large, so as to reduce difficulty and cost of manufacturing process. In the embodiment, if the size of each sub-pixel is set to be smaller, the display device may acquire higher physical resolution, in order to improve the display resolution of the display device. In the embodiment, by setting new arrangement manners and calculating the output value of each sub-pixel by using a corresponding virtual algorithm, the input value of each sub-pixel is more close to the input value thereof, so as to improve the display quality. The display device of the embodiment may realize higher display resolution with lower physical resolution, so that the process cost is reduced. The display device of the embodiment may realize higher display resolution with fewer sub-pixels, so that the display effect is increased.

It is understandable that the foregoing embodiments merely are exemplary embodiments of the invention, but the invention is not limited thereto. Those of ordinary skill in the art may make changes and improvements without departing from the spirit and essence of the invention, and such changes and improvements are regarded as the protection scope of the invention.

The foregoing embodiments merely are exemplary embodiments of the invention, and not intended to define the scope of the invention, and the scope of the invention is determined by the appended claims.

The present application claims priority of Chinese Patent Application No. 201410379572.5 filed on Aug. 4, 2014, the disclosure of which is incorporated herein by reference in its entirety as part of the present application.

What is claimed is:

1. A display substrate, comprising two types of pixel rows arranged alternately and repeatedly, wherein in one type of pixel row, a second sub-pixel, a third sub-pixel, a second sub-pixel, a first sub-pixel and a third sub-pixel are arranged successively and repeatedly; in the other type of pixel row, a third sub-pixel, a first sub-pixel, a second sub-pixel, a third sub-pixel and a second sub-pixel are arranged successively and repeatedly; a center line of any sub-pixel in a column direction in a pixel row does not coincide with a center line of any sub-pixel in the column direction in an adjacent pixel row;

the first sub-pixels, the second sub-pixels and the third sub-pixels form a plurality of pixel groups, the plurality of pixel groups including a plurality of first pixel groups and a plurality of second pixel groups;

constituent parts of the pixel groups include a first pixel row, a second pixel row and a third pixel row, the first pixel row including one second sub-pixel and one third sub-pixel, the second pixel row including one third sub-pixel, one first sub-pixel and one second sub-pixel, and the third pixel row including one second sub-pixel and one third sub-pixel; each of the first pixel groups includes a second pixel row and a third pixel row or includes a first pixel row and a second pixel row; each of the second pixel groups includes a first pixel row, a second pixel row and a third pixel row;

in two adjacent pixel groups in the column direction, a third pixel row of one pixel group and a first pixel row of the other pixel group share a second sub-pixel and a third sub-pixel.

2. The display substrate according to claim 1, wherein, in the second pixel row, the first sub-pixel is a sub-pixel in the middle among three sub-pixels.

3. The display substrate according to claim 1, wherein, in a same column of pixel group, sub-pixels in respective first pixel rows are arranged in a same sequence, sub-pixels in respective second pixel rows are arranged in a same sequence, and sub-pixels in respective third pixel rows are arranged in a same sequence.

4. The display substrate according to claim 1, wherein, in each pixel group, the second sub-pixels and the third sub-pixels are arranged around the first sub-pixel alternately, and any two adjacent second sub-pixel and third sub-pixel form a pixel with the first sub-pixel.

5. The display substrate according to claim 1, wherein, each of the second pixel groups includes seven sub-pixels, the seven sub-pixels including a first sub-pixel in the middle, and three second sub-pixels and three third sub-pixels arranged around the first sub-pixel alternately.

6. The display substrate according to claim 1, wherein, each of the first pixel groups includes five sub-pixels, of which two second sub-pixels and two third sub-pixels are arranged around one first sub-pixel alternately.

7. The display substrate according to claim 1, the second sub-pixel and third sub-pixel in the first pixel row are arranged successively, the third sub-pixel, first sub-pixel and second sub-pixel in the second pixel row are arranged successively, and the second sub-pixel and third sub-pixel in the third pixel row are arranged successively; the second sub-pixel in the first pixel row and the third sub-pixel and first sub-pixel in the second pixel row form a first pixel; the second sub-pixel and third sub-pixel in the first pixel row and the first sub-pixel in the second pixel row form a second pixel; the third sub-pixel in the first pixel row and the first sub-pixel and second sub-pixel in the second pixel row form a third pixel; the third sub-pixel and first sub-pixel in the second pixel row and the second sub-pixel in the third pixel row form a fourth pixel; the first sub-pixel in the second pixel row and the second sub-pixel and third sub-pixel in the third pixel row form a fifth pixel; the first sub-pixel and second sub-pixel in the second pixel row and the third sub-pixel in the third pixel row form a sixth pixel; or the third sub-pixel and second sub-pixel in the first pixel row are arranged successively, the second sub-pixel, first sub-pixel and third sub-pixel in the second pixel row are arranged successively, the third sub-pixel and second sub-pixel in the third pixel row are arranged successively; the third sub-pixel in the first pixel row and the second sub-pixel and first sub-pixel in the second pixel row form a first pixel; the third sub-pixel and second sub-pixel in the first pixel row and the first sub-pixel in the second pixel row form a second pixel; the second sub-pixel in the first pixel row and the first sub-pixel and third sub-pixel in the second pixel row form a third pixel; the second sub-pixel and first sub-pixel in the second pixel row and the third sub-pixel in the third pixel row form a fourth pixel; the first sub-pixel in the second pixel row and the third sub-pixel and second sub-pixel in the third pixel row form a fifth pixel; the first sub-pixel and third sub-pixel in the second pixel row and the second sub-pixel in the third pixel row form a sixth pixel.

8. The display substrate according to claim 1, wherein, the first pixel group is located on an upper edge or lower edge of a display region of the display substrate.

9. The display substrate according to claim 1, wherein, a row direction of the pixel row is perpendicular to the column direction.

10. A display device, comprising the display substrate according to claim 1.

11. A driving method of a display substrate, the method being used for driving the display substrate according to claim 1;
the driving method comprising:
acquiring an output value of the first sub-pixel, an output value of the second sub-pixel and an output value of the third sub-pixel;
outputting the output value of the first sub-pixel, the output value of the second sub-pixel and the output value of the third sub-pixel.

12. The driving method of the display substrate according to claim 11, wherein, in each pixel group, the second sub-pixels and the third sub-pixels are arranged around the first sub-pixel alternately, and any two adjacent second sub-pixel and third sub-pixel and the first sub-pixel form a pixel; acquiring the output value of the first sub-pixel, the output value of the second sub-pixel and the output value of the third sub-pixel includes:
for each sub-pixel used for forming a plurality of pixels, conducting a weighted average process on output values of the sub-pixel corresponding to each pixel associated with the sub-pixel, to generate the output value of the sub-pixel.

13. The driving method of the display substrate according to claim 11, wherein, the second pixel row in the first pixel group is located on an upper edge, the third sub-pixel, first sub-pixel and second sub-pixel in the second pixel row are arranged successively, the second sub-pixel and third sub-pixel in the third pixel row are arranged successively, the third sub-pixel and first sub-pixel in the second pixel row and the second sub-pixel in the third pixel row form a fourth pixel; the first sub-pixel in the second pixel row and the second sub-pixel and third sub-pixel in the third pixel row form a fifth pixel; and the first sub-pixel and second sub-pixel in the second pixel row and the third sub-pixel in the third pixel row form a sixth pixel; acquiring the output value of the first sub-pixel, the output value of the second sub-pixel and the output value of the third sub-pixel includes:
setting an input value of the third sub-pixel of the fourth pixel in the first pixel group as an output value of the third sub-pixel of the second pixel row;
conducting a weighted average process on an input value of the first sub-pixel of the fourth pixel, an input value of the first sub-pixel of the fifth pixel, and an input value of the first sub-pixel of the sixth pixel in the first pixel group, to generate an output value of the first sub-pixel of the second pixel row;
setting an input value of the second sub-pixel of the sixth pixel in the first pixel group as an output value of the second sub-pixel of the second pixel row;
conducting a weighted average process on an input value of the second sub-pixel of the fourth pixel and an input value of the second sub-pixel of the fifth pixel in the first pixel group, and an input value of a second sub-pixel of a first pixel and an input value of a second sub-pixel of a second pixel in an adjacent pixel group which shares the sub-pixels of the third pixel row in the first pixel group with the first pixel group, to generate an output value of the second sub-pixel of the third pixel row;
conducting a weighted average process on an input value of the third sub-pixel of the fifth pixel and an input value of the third sub-pixel of the sixth pixel in the first pixel group, and an input value of a third sub-pixel of the second pixel and an input value of a third sub-pixel of a third pixel in the adjacent pixel group which shares the sub-pixels of the third pixel row in the first pixel group with the first pixel group, to generate an output value of the third sub-pixel of the third pixel row; or the second pixel row in the first pixel group is located on an upper edge, the second sub-pixel, first sub-pixel and third sub-pixel in the second pixel row are arranged successively, the third sub-pixel and second sub-pixel in the third pixel row are arranged successively, the second sub-pixel and first sub-pixel in the second pixel row and the third sub-pixel in the third pixel row form a fourth pixel; the first sub-pixel in the second pixel row and the third sub-pixel and second sub-pixel in the third pixel row form a fifth pixel; the first sub-pixel and third sub-pixel in the second pixel row and the second sub-pixel in the third pixel row form a sixth pixel; acquiring the output value of a first sub-pixel, the output value of the second sub-pixel and the output value of the third sub-pixel includes:
setting an input value of the second sub-pixel of the fourth pixel in the first pixel group as an output value of the second sub-pixel of the second pixel row;
conducting a weighted average process on an input value of the first sub-pixel of the fourth pixel, an input value of the first sub-pixel of the fifth pixel, and an input value of the first sub-pixel of the sixth pixel in the first pixel group, to generate an output value of the first sub-pixel of the second pixel row;
setting an input value of the third sub-pixel of the sixth pixel in the first pixel group as an output value of the third sub-pixel of the second pixel row;
conducting a weighted average process on an input value of the third sub-pixel of the fourth pixel and an input value of the third sub-pixel of the fifth pixel in the first pixel group, and an input value of a third sub-pixel of a first pixel and an input value of a third sub-pixel of a second pixel in an adjacent pixel group which shares the sub-pixels of the third pixel row in the first pixel group with the first pixel group, to generate an output value of the third sub-pixel of the third pixel row;
conducting a weighted average process on an input value of the second sub-pixel of the fifth pixel and an input value of the second sub-pixel of the sixth pixel in the first pixel group, and an input value of a second sub-pixel of the second pixel and an input value of a second sub-pixel of a third pixel in the adjacent pixel group which shares the sub-pixels of the third pixel row in the first pixel group with the first pixel group, to generate the output value of the second sub-pixel of the third pixel row.

14. The driving method of the display substrate according to claim 11, wherein, the second pixel row in the first pixel group is located on a lower edge, the second sub-pixel and third sub-pixel in the first pixel row are arranged successively, the third sub-pixel, first sub-pixel and second sub-pixel in the second pixel row are arranged successively, the second sub-pixel in the first pixel row and the third sub-pixel and first sub-pixel in the second pixel row form a first pixel; the second sub-pixel and third sub-pixel in the first pixel row and the first sub-pixel in the second pixel row form a second pixel; and the third sub-pixel in the first pixel row and the first sub-pixel and second sub-pixel in the second pixel row form a third pixel; acquiring the output value of the first sub-pixel, the output value of the second sub-pixel and the output value of the third sub-pixel includes:
conducting a weighted average process on an input value of the second sub-pixel of the first pixel and an input value of the second sub-pixel of the second pixel in the first pixel group, and an input value of a second sub-pixel of a fourth pixel and an input value of a second sub-pixel of a fifth pixel in an adjacent pixel group which shares the sub-pixels of the first pixel row in the first pixel group with the first pixel group, to generate an output value of the second sub-pixel of the first pixel row;

conducting a weighted average process on an input value of the third sub-pixel of the second pixel and an input value of the third sub-pixel of the third pixel in the first pixel group, and an input value of a third sub-pixel of the fifth pixel and an input value of a third sub-pixel of a sixth pixel in the adjacent pixel group which shares the sub-pixels of the first pixel row in the first pixel group with the first pixel group, to generate an output value of the third sub-pixel of the first pixel row;

setting an input value of the third sub-pixel of the first pixel in the first pixel group as an output value of the third sub-pixel of the second pixel row;

conducting a weighted average process on an input value of the first sub-pixel of the first pixel, an input value of the first sub-pixel of the second pixel and an input value of the first sub-pixel of the third pixel in the first pixel group, to generate an output value of the first sub-pixel of the second pixel row;

setting an input value of the second sub-pixel of the third pixel in the first pixel group as an output value of the second sub-pixel of the second pixel row; or the second pixel row in the first pixel group is located on a lower edge, the third sub-pixel and second sub-pixel in the first pixel row are arranged successively, the second sub-pixel, first sub-pixel and third sub-pixel in the second pixel row are arranged successively, the third sub-pixel in the first pixel row and the second sub-pixel and first sub-pixel in the second pixel row form a first pixel; the third sub-pixel and second sub-pixel in the first pixel row and the first sub-pixel in the second pixel row form a second pixel; the second sub-pixel in the first pixel row and the first sub-pixel and third sub-pixel in the second pixel row form a third pixel; acquiring the output value of the first sub-pixel, the output value of the second sub-pixel and the output value of the third sub-pixel includes:

conducting a weighted average process on an input value of the third sub-pixel of the first pixel and an input value of the third sub-pixel of the second pixel in the first pixel group, and an input value of a third sub-pixel of a fourth pixel and an input value of a third sub-pixel of a fifth pixel in an adjacent pixel group which shares the sub-pixels of the first pixel row in the first pixel group with the first pixel group, to generate an output value of the third sub-pixel of the first pixel row;

conducting a weighted average process on an input value of the second sub-pixel of the second pixel and an input value of the second sub-pixel of the third pixel in the first pixel group, and an input value of a second sub-pixel of the fifth pixel and an input value of a second sub-pixel of a sixth pixel in the adjacent pixel group which shares the sub-pixels of the first pixel row in the first pixel group with the first pixel group, to generate an output value of the second sub-pixel of the first pixel row;

setting an input value of the second sub-pixel of the first pixel in the first pixel group as an output value of the second sub-pixel of the second pixel row;

conducting a weighted average process on an input value of the first sub-pixel of the first pixel, an input value of the first sub-pixel of the second pixel and an input value of the first sub-pixel of the third pixel in the first pixel group, to generate an output value of the first sub-pixel of the second pixel row;

setting an input value of the third sub-pixel of the third pixel in the first pixel group as an output value of the third sub-pixel of the second pixel row.

15. The driving method of display substrate according to claim 11, wherein, the first pixel row in the second pixel group is located on an upper edge, the second sub-pixel and third sub-pixel in the first pixel row are arranged successively, the third sub-pixel, first sub-pixel and second sub-pixel in the second pixel row are arranged successively, the second sub-pixel and third sub-pixel in the third pixel row are arranged successively, the second sub-pixel in the first pixel row and the third sub-pixel and first sub-pixel in the second pixel row form a first pixel; the second sub-pixel and third sub-pixel in the first pixel row and the first sub-pixel in the second pixel row form a second pixel; the third sub-pixel in the first pixel row and the first sub-pixel and second sub-pixel in the second pixel row form a third pixel; the third sub-pixel and first sub-pixel in the second pixel row and the second sub-pixel in the third pixel row form a fourth pixel; the first sub-pixel in the second pixel row and the second sub-pixel and third sub-pixel in the third pixel row form a fifth pixel; and the first sub-pixel and second sub-pixel in the second pixel row and the third sub-pixel in the third pixel row form a sixth pixel; acquiring the output value of the first sub-pixel, the output value of the second sub-pixel and the output value of the third sub-pixel includes:

conducting a weighted average process on an input value of the second sub-pixel of the first pixel and an input value of the second sub-pixel of the second pixel in the second pixel group, to generate an output value of the second sub-pixel of the first pixel row;

conducting a weighted average process on an input value of the third sub-pixel of the second pixel and an input value of the third sub-pixel of the third pixel in the second pixel group, to generate an output value of the third sub-pixel of the first pixel row;

conducting a weighted average process on an input value of the third sub-pixel of the first pixel and an input value of the third sub-pixel of the fourth pixel in the second pixel group, to generate an output value of the third sub-pixel of the second pixel row;

conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel, to generate an output value of the first sub-pixel of the second pixel row;

conducting a weighted average process on an input value of the second sub-pixel of the third pixel and an input value of the second sub-pixel of the sixth pixel in the second pixel group, to generate an output value of the second sub-pixel of the second pixel row;

conducting a weighted average process on an input value of the second sub-pixel of the fourth pixel and an input value of the second sub-pixel of the fifth pixel in the second pixel group, and an input value of a second sub-pixel of a first pixel and an input value of a second sub-pixel of a second pixel in an adjacent pixel group which shares the sub-pixels of the third pixel row in the second pixel group with the second pixel group, to generate an output value of the second sub-pixel of the third pixel row;

conducting a weighted average process on an input value of the third sub-pixel of the fifth pixel and an input value of the third sub-pixel of the sixth pixel in the second pixel group, and an input value of a third sub-pixel of the second pixel and an input value of a third sub-pixel of a third pixel in the adjacent pixel group which shares the sub-pixels of the third pixel row in the second pixel group with the second pixel group, to generate an output value of the third sub-pixel of the third pixel row; or the first pixel row in the second pixel group is located on an upper edge, the third sub-pixel and second sub-pixel in the first pixel row are arranged successively, the second sub-pixel, first sub-pixel and third sub-pixel in the second pixel row are arranged successively, the third sub-pixel and second sub-pixel in the third pixel row are arranged successively, the third sub-pixel in the first pixel row and the second sub-pixel and first sub-pixel in the second pixel row form a first pixel; the third sub-pixel and second sub-pixel in the first pixel row and the first sub-pixel in the second pixel row form a second pixel; the second sub-pixel in the first pixel row and the first sub-pixel and third sub-pixel in the second pixel row form a third pixel; the second sub-pixel and first sub-pixel in the second pixel row and the third sub-pixel in the third pixel row form a fourth pixel; the first sub-pixel in the second pixel row and the third sub-pixel and second sub-pixel in the third pixel row form a fifth pixel; and the first sub-pixel and third sub-pixel in the second pixel row and the second sub-pixel in the third pixel row form a sixth pixel; acquiring the output value of the first sub-pixel, the output value of the third sub-pixel and the output value of the second sub-pixel includes:

conducting a weighted average process on an input value of the third sub-pixel of the first pixel and an input value of the third sub-pixel of the second pixel in the second pixel group, to generate an output value of the third sub-pixel of the first pixel row;

conducting a weighted average process on an input value of the second sub-pixel of the second pixel and an input value of the second sub-pixel of the third pixel in the second pixel group, to generate an output value of the second sub-pixel of the first pixel row;

conducting a weighted average process on an input value of the second sub-pixel of the first pixel and an input value of the second sub-pixel of the fourth pixel in the second pixel group, to generate an output value of the second sub-pixel of the second pixel row;

conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row;

conducting a weighted average process on an input value of the third sub-pixel of the third pixel and an input value of the third sub-pixel of the sixth pixel in the second pixel group, to generate an output value of the third sub-pixel of the second pixel row;

conducting a weighted average process on an input value of the third sub-pixel of the fourth pixel and an input value of the third sub-pixel of the fifth pixel in the second pixel group, and an input value of a third sub-pixel of a first pixel and an input value of a third sub-pixel of a second pixel in an adjacent pixel group which shares the sub-pixels of the third pixel row in the second pixel group with the second pixel group, to generate an output value of the third sub-pixel of the third pixel row;

conducting a weighted average process on an input value of the second sub-pixel of the fifth pixel and an input value of the second sub-pixel of the sixth pixel in the second pixel group, and an input value of a second sub-pixel of the second pixel and an input value of a second sub-pixel of a third pixel in the adjacent pixel group which shares the sub-pixels of the third pixel row in the second pixel group with the second pixel group, to generate an output value of the second sub-pixel of the third pixel row.

16. The driving method of the display substrate according to claim 11, wherein, the third pixel row in the second pixel group is located on a lower edge, the second sub-pixel and third sub-pixel in the first pixel row are arranged successively, the third sub-pixel, first sub-pixel and second sub-pixel in the second pixel row are arranged successively, the second sub-pixel and third sub-pixel in the third pixel row are arranged successively, the second sub-pixel in the first pixel row and the third sub-pixel and first sub-pixel in the second pixel row form a first pixel; the second sub-pixel and third sub-pixel in the first pixel row and the first sub-pixel in the second pixel row form a second pixel; the third sub-pixel in the first pixel row and the first sub-pixel and second sub-pixel in the second pixel row form a third pixel; the third sub-pixel and first sub-pixel in the second pixel row and the second sub-pixel in the third pixel row form a fourth pixel; the first sub-pixel in the second pixel row and the second sub-pixel and third sub-pixel in the third pixel row form a fifth pixel; the first sub-pixel and second sub-pixel in the second pixel row and the third sub-pixel in the third pixel row form a sixth pixel; acquiring the output value of the first sub-pixel, the output value of the second sub-pixel and the output value of the third sub-pixel includes:

conducting a weighted average process on an input value of the second sub-pixel of the first pixel and an input value of the second sub-pixel of the second pixel in the second pixel group, and an input value of a second sub-pixel of a fourth pixel and an input value of a second sub-pixel of a fifth pixel in an adjacent pixel group which shares the sub-pixels of the first pixel row in the second pixel group with the second pixel group, to generate an output value of the second sub-pixel of the first pixel row;

conducting a weighted average process on an input value of the third sub-pixel of the second pixel and an input value of the third sub-pixel of the third pixel in the second pixel group, and an input value of a third sub-pixel of the fifth pixel and an input value of a third sub-pixel of a sixth pixel in the adjacent pixel group which shares the sub-pixels of the first pixel row in the second pixel group with the second pixel group, to generate an output value of the third sub-pixel of the first pixel row;

conducting a weighted average process on an input value of the third sub-pixel of the first pixel and an input value of the third sub-pixel of the fourth pixel in the second pixel group, to generate an output value of the third sub-pixel of the second pixel row;

conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row;

conducting a weighted average process on an input value of the second sub-pixel of the third pixel and an input value of the second sub-pixel of the sixth pixel in the second pixel group, to generate an output value of the second sub-pixel of the second pixel row;

conducting a weighted average process on an input value of the second sub-pixel of the fourth pixel and an input value of the second sub-pixel of the fifth pixel in the second pixel group, to generate an output value of the second sub-pixel of the third pixel row;

conducting a weighted average process on an input value of the third sub-pixel of the fifth pixel and an input value of the third sub-pixel of the sixth pixel in the second pixel group, to generate an output value of the third sub-pixel of the third pixel row; or the third pixel row in the second pixel group is located on a lower edge, the third sub-pixel and second sub-pixel in the first pixel row are arranged successively, the second sub-pixel, first sub-pixel and third sub-pixel in the second pixel row are arranged successively, the third sub-pixel and second sub-pixel in the third pixel row are arranged successively, the third sub-pixel in the first pixel row and the second sub-pixel and first sub-pixel in the second pixel row form a first pixel; the third sub-pixel and second sub-pixel in the first pixel row and the first sub-pixel in the second pixel row form a second pixel; the second sub-pixel in the first pixel row and the first sub-pixel and third sub-pixel in the second pixel row form a third pixel; the second sub-pixel and first sub-pixel in the second pixel row and the third sub-pixel in the third pixel row form a fourth pixel; the first sub-pixel in the second pixel row and the third sub-pixel and second sub-pixel in the third pixel row form a fifth pixel; and the first sub-pixel and third sub-pixel in the second pixel row and the second sub-pixel in the third pixel row form a sixth pixel; acquiring the output value of the first sub-pixel, the output value of the third sub-pixel and the output value of the second sub-pixel includes:

conducting a weighted average process on an input value of the third sub-pixel of the first pixel and an input value of the third sub-pixel of the second pixel in the second pixel group, and an input value of a third sub-pixel of a fourth pixel and an input value of a third sub-pixel of a fifth pixel in an adjacent pixel group which shares the sub-pixels of the first pixel row in the second pixel group with the second pixel group, to generate an output value of the third sub-pixel of the first pixel row;

conducting a weighted average process on an input value of the second sub-pixel of the second pixel and an input value of the second sub-pixel of the third pixel in the second pixel group, and an input value of a second sub-pixel of the fifth pixel and an input value of a second sub-pixel of a sixth pixel in the adjacent pixel group which shares the sub-pixels of the first pixel row in the second pixel group with the second pixel group, to generate an output value of the second sub-pixel of the first pixel row;

conducting a weighted average process on an input value of the second sub-pixel of the first pixel and an input value of the second sub-pixel of the fourth pixel in the second pixel group, to generate an output value of the second sub-pixel of the second pixel row;

conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row;

conducting a weighted average process on an input value of the third sub-pixel of the third pixel and an input value of the third sub-pixel of the sixth pixel in the second pixel group, to generate an output value of the third sub-pixel of the second pixel row;

conducting a weighted average process on an input value of the third sub-pixel of the fourth pixel and an input value of the third sub-pixel of the fifth pixel in the second pixel group, to generate an output value of the third sub-pixel of the third pixel row;

conducting a weighted average process on an input value of the second sub-pixel of the fifth pixel and an input value of the second sub-pixel of the sixth pixel in the second pixel group, to generate an output value of the second sub-pixel of the third pixel row.

17. The driving method of the display substrate according to claim 11, wherein, the second pixel group is located at a location other than upper and lower edges, the second sub-pixel and third sub-pixel in the first pixel row are arranged successively, the third sub-pixel, first sub-pixel and second sub-pixel in the second pixel row are arranged successively, the second sub-pixel and third sub-pixel in the third pixel row are arranged successively, the second sub-pixel in the first pixel row and the third sub-pixel and first sub-pixel in the second pixel row form a first pixel; the second sub-pixel and third sub-pixel in the first pixel row and the first sub-pixel in the second pixel row form a second pixel; the third sub-pixel in the first pixel row and the first sub-pixel and second sub-pixel in the second pixel row form a third pixel; the third sub-pixel and first sub-pixel in the second pixel row and the second sub-pixel in third pixel row form a fourth pixel; the first sub-pixel in the second pixel row and the second sub-pixel and third sub-pixel in the third pixel row form a fifth pixel; and the first sub-pixel and second sub-pixel in the second pixel row and the third sub-pixel in the third pixel row form a sixth pixel; acquiring the output value of the first sub-pixel, the output value of the second sub-pixel and the output of the third sub-pixel includes:

conducting a weighted average process on an input value of the second sub-pixel of the first pixel and an input value of the second sub-pixel of the second pixel in the second pixel group, and an input value of a second sub-pixel of a fourth pixel and an input value of a second sub-pixel of a fifth pixel in an adjacent pixel group which shares the sub-pixels of the first pixel row in the second pixel group with the second pixel group, to generate an output value of the second sub-pixel of the first pixel row;

conducting a weighted average process on an input value of the third sub-pixel of the second pixel and an input value of the third sub-pixel of the third pixel in the second pixel group, and an input value of a third sub-pixel of the fifth pixel and an input value of a third sub-pixel of a sixth pixel in the adjacent pixel group which shares the sub-pixels of the first pixel row in the second pixel group with the second pixel group, to generate an output value of the third sub-pixel of the first pixel row;

conducting a weighted average process on an input value of the third sub-pixel of the first pixel and an input value of the third sub-pixel of the fourth pixel in the second pixel group, to generate an output value of the third sub-pixel of the second pixel row;

conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row;

conducting a weighted average process on an input value of the second sub-pixel of the third pixel and an input value of the second sub-pixel of the sixth pixel in the second pixel group, to generate an output value of the second sub-pixel of the second pixel row;

conducting a weighted average process on an input value of the second sub-pixel of the fourth pixel and an input value of the second sub-pixel of the fifth pixel in the second pixel group, and an input value of a second sub-pixel of the first pixel and an input value of a second sub-pixel of a second pixel in the adjacent pixel group which shares the sub-pixels of the third pixel row in the second pixel group with the second pixel group, to generate an output value of the second sub-pixel of the third pixel row;

conducting a weighted average process on an input value of the third sub-pixel of the fifth pixel and an input value of the third sub-pixel of the sixth pixel in the second pixel group, and an input value of a third sub-pixel of the second pixel and an input value of a third sub-pixel of a third pixel in the adjacent pixel group which shares the sub-pixels of the third pixel row in the second pixel group with the second pixel group, to generate an output value of the third sub-pixel of the third pixel row; or the second pixel group is located at a location other than the upper and lower edges, the third sub-pixel and second sub-pixel in the first pixel row are arranged successively, the second sub-pixel, first sub-pixel and third sub-pixel in the second pixel row are arranged successively, the third sub-pixel and second sub-pixel in the third pixel row are arranged successively, the third sub-pixel in the first pixel row and the second sub-pixel and first sub-pixel in the second pixel row form a first pixel; the third sub-pixel and second sub-pixel in the first pixel row and the first sub-pixel in the second pixel row form a second pixel; the second sub-pixel in the first pixel row and the first sub-pixel and third sub-pixel in the second pixel row form a third pixel; the second sub-pixel and first sub-pixel in the second pixel row and the third sub-pixel in the third pixel row form a fourth pixel; the first sub-pixel in the second pixel row and the third sub-pixel and second sub-pixel in the third pixel row form a fifth pixel; and the first sub-pixel and third sub-pixel in the second pixel row and the second sub-pixel in the third pixel row form a sixth pixel; acquiring the output value of the first sub-pixel, the output value of the second sub-pixel and the output value of the third sub-pixel includes:

conducting a weighted average process on an input value of the third sub-pixel of the first pixel and an input value of the third sub-pixel of the second pixel in the second pixel group, and an input value of a third sub-pixel of a fourth pixel and an input value of a third sub-pixel of a fifth pixel in an adjacent pixel group which shares the sub-pixels of the first pixel row in the second pixel group with the second pixel group, to generate an output value of the third sub-pixel of the first pixel row;

conducting a weighted average process on an input value of the second sub-pixel of the second pixel and an input value of the second sub-pixel of the third pixel in the second pixel group, and an input value of a second sub-pixel of the fifth pixel and an input value of a second sub-pixel of a sixth pixel in the adjacent pixel group which shares the sub-pixels of the first pixel row in the second pixel group with the second pixel group, to generate an output value of the second sub-pixel of the first pixel row;

conducting a weighted average process on an input value of the second sub-pixel of the first pixel and an input value of the second sub-pixel of the fourth pixel in the second pixel group, to generate an output value of the second sub-pixel of the second pixel row;

conducting a weighted average process on an input value of the first sub-pixel of the first pixel, an input value of the first sub-pixel of the second pixel, an input value of the first sub-pixel of the third pixel, an input value of the first sub-pixel of the fourth pixel, an input value of the first sub-pixel of the fifth pixel, and an input value of the first sub-pixel of the sixth pixel in the second pixel group, to generate an output value of the first sub-pixel of the second pixel row;

conducting a weighted average process on an input value of the third sub-pixel of the third pixel and an input value of the third sub-pixel of the sixth pixel in the second pixel group, to generate an output value of the third sub-pixel of the second pixel row;

conducting a weighted average process on an input value of the third sub-pixel of the fourth pixel and an input value of the third sub-pixel of the fifth pixel in the second pixel group, and an input value of a third sub-pixel of the first pixel and an input value of a third sub-pixel of a second pixel in the adjacent pixel group which shares the sub-pixels of the third pixel row in the second pixel group with the second pixel group, to generate an output value of the third sub-pixel of the third pixel row;

conducting a weighted average process on an input value of the second sub-pixel of the fifth pixel and an input value of the second sub-pixel of the sixth pixel in the second pixel group, and an input value of the second sub-pixel of the second pixel and an input value of a second sub-pixel of a third pixel in the adjacent pixel group which shares the sub-pixels of the third pixel row in the second pixel group with the second pixel group, to generate an output value of the second sub-pixel of the third pixel row.

18. The display substrate according to claim 2, wherein, in a same column of pixel group, sub-pixels in respective first pixel rows are arranged in a same sequence, sub-pixels in respective second pixel rows are arranged in a same sequence, and sub-pixels in respective third pixel rows are arranged in a same sequence.

19. The display substrate according to claim 2, wherein, in each pixel group, the second sub-pixels and the third sub-pixels are arranged around the first sub-pixel alternately, and any two adjacent second sub-pixel and third sub-pixel form a pixel with the first sub-pixel.

20. The display substrate according to claim 2, wherein, each of the second pixel groups includes seven sub-pixels, the seven sub-pixels including a first sub-pixel in the middle, and three second sub-pixels and three third sub-pixels arranged around the first sub-pixel alternately.

* * * * *

UNITED STATES PATENT AND TRADEMARK OFFICE
CERTIFICATE OF CORRECTION

PATENT NO. : 9,437,128 B2
APPLICATION NO. : 14/768962
DATED : September 6, 2016
INVENTOR(S) : Kai Yang et al.

It is certified that error appears in the above-identified patent and that said Letters Patent is hereby corrected as shown below:

On the Title Page

Under Foreign Application Priority Data:
Please delete "2014 1 03795572" and insert --2014 1 0379572--

Signed and Sealed this
Sixth Day of June, 2017

Michelle K. Lee
*Director of the United States Patent and Trademark Office*